United States Patent
Park

(10) Patent No.: US 9,230,612 B2
(45) Date of Patent: Jan. 5, 2016

(54) SEMICONDUCTOR DEVICES AND METHODS OF FABRICATING THE SAME

(71) Applicant: Jemin Park, Suwon-si (KR)

(72) Inventor: Jemin Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 34 days.

(21) Appl. No.: 14/051,841

(22) Filed: Oct. 11, 2013

(65) Prior Publication Data

US 2014/0112050 A1 Apr. 24, 2014

(30) Foreign Application Priority Data

Oct. 18, 2012 (KR) .................. 10-2012-0116180

(51) Int. Cl.
*G11C 5/06* (2006.01)
*H01L 27/108* (2006.01)

(52) U.S. Cl.
CPC .......... *G11C 5/063* (2013.01); *H01L 27/10882* (2013.01); *H01L 27/10885* (2013.01); *H01L 27/10888* (2013.01); *H01L 27/10891* (2013.01)

(58) Field of Classification Search
CPC ................................... G11C 5/025; G11C 7/18
USPC ................................................ 365/72, 51, 63
See application file for complete search history.

(56) References Cited

U.S. PATENT DOCUMENTS

| | | | |
|---|---|---|---|
| 6,159,820 A | 12/2000 | Park | |
| 6,861,313 B2 | 3/2005 | Song | |
| 7,998,870 B2 | 8/2011 | Nam | |
| 8,048,737 B2 | 11/2011 | Kim et al. | |
| 8,247,324 B2 | 8/2012 | Shin et al. | |
| 8,797,777 B2 * | 8/2014 | Hishida et al. | 365/51 |
| 2002/0022315 A1 | 2/2002 | Bronner et al. | |
| 2011/0101450 A1 | 5/2011 | Kim | |
| 2011/0260238 A1 * | 10/2011 | Kim | 257/330 |
| 2012/0025314 A1 | 2/2012 | Kim | |

FOREIGN PATENT DOCUMENTS

| | | |
|---|---|---|
| KR | 2011-0001136 A | 1/2011 |
| KR | 2011-0001722 A | 1/2011 |
| KR | 10-1120175 B1 | 2/2012 |
| KR | 10-1161750 B1 | 7/2012 |

* cited by examiner

*Primary Examiner* — Huan Hoang
(74) *Attorney, Agent, or Firm* — Harness, Dickey & Pierce, P.L.C.

(57) ABSTRACT

A semiconductor device includes a plurality of word lines; a plurality of bit lines; and a plurality of bit line node contacts. The plurality of word lines extend in a first direction in or on a substrate. The plurality of bit lines crosses over the plurality of word lines. Each of the plurality of bit line node contacts connects a corresponding bit line to the substrate, and each of the plurality of bit line node contacts has a width substantially equal to a width of the corresponding bit line.

20 Claims, 42 Drawing Sheets

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0116180, filed on Oct. 18, 2012, the entire contents of which are incorporated by reference herein.

BACKGROUND

1. Field

Inventive concepts relate to semiconductor devices and methods of fabricating the same.

2. Description of Conventional Art

Semiconductor devices are attractive in the electronic industry because of their small size, multi-function, and/or low fabrication costs. However, semiconductor devices have been highly integrated with the development of the electronic industry. Widths and spaces of patterns of the semiconductor devices have been more and more reduced for higher integration of the semiconductor devices. Recently, new and/or more expensive exposure techniques are required for fine patterns of the semiconductor devices, such that it is difficult to highly integrate the semiconductor device. Thus, various researches are being conducted for new integration techniques.

SUMMARY

Example embodiments of inventive concepts may provide semiconductor devices capable of suppressing (e.g., preventing and/or minimizing) leakage current.

Example embodiments of inventive concepts also provide methods of fabricating ore highly integrated semiconductor devices capable of suppressing and/or resolving mask misalignment problems.

In at least one example embodiment, a semiconductor device may include: a plurality of word lines in or on a substrate with a gate insulation layer therebetween, the plurality of word lines extending in a first direction; a plurality of bit lines on the substrate to cross over the word lines; and a bit line node contact connecting each of the plurality of bit lines to the substrate. Each bit line may have a width equal or substantially equal to a width of a corresponding bit line node contact.

In at least one other example embodiment, a semiconductor device may include: at least two storage node contacts in or on a substrate; a bit line node contact in or on the substrate between the at least two storage node contacts; and a bit line on the bit line node contact between the at least two storage node contacts, the bit line node contact and the bit line being spaced apart from sidewalls of the at least two storage node contacts by a spacer.

In at least one other example embodiment, a semiconductor device may include: at least two storage node contacts in or on a substrate; a bit line node contact on the substrate between the at least two storage node contacts; and a bit line on the bit line node contact between the at least two storage node contacts, each of the bit line node contact and the bit line being spaced apart from sidewalls of the at least two storage node contacts by substantially the same distance.

In at least one other example embodiment, a semiconductor device may include: a plurality of word lines extending in a first direction in or on a substrate; a plurality of bit lines crossing over the plurality of word lines; and a plurality of bit line node contacts, each of the plurality of bit line node contacts connecting a corresponding bit line to the substrate, and each of the plurality of bit line node contacts having a width substantially equal to a width of the corresponding bit line.

According to at least some example embodiments, a sidewall of a bit line may be aligned with a sidewall of a bit line node contact.

The semiconductor device may further include: a storage node contact between the plurality of bit lines and connected to the substrate. The storage node contact may be insulated from the plurality of bit lines. A distance between a sidewall of a storage node contact and a bit line adjacent to the sidewall may be equal or substantially equal to a distance between another sidewall of the storage node contact and a bit line adjacent to the other sidewall.

A distance between the bit line node contact and the storage node contact may be equal or substantially equal to a distance between the bit line and the storage node contact.

According to at least some example embodiments, the semiconductor device may further include: a storage node pad between the storage node contact and the substrate. The storage node pad may have a width greater than a width of the storage node contact. A sidewall of the storage node pad may be aligned with a sidewall of the storage node contact.

The semiconductor device may further include: a separation pattern between the adjacent storage node pads. The separation pattern may vertically overlap with a bit line.

The semiconductor device may further include: a buried insulation layer between a bit line and the substrate at a side of a corresponding bit line node contact. A sidewall of the buried insulation layer may be aligned with a sidewall of the storage node contact.

The semiconductor device may further include: an insulation spacer between a bit line and a corresponding storage node contact, and between a bit line node contact and the corresponding storage node contact. The insulation spacer may include an air gap.

The semiconductor device may further include: a data storage element electrically connected to a storage node contact.

At least one other example embodiment provides a method of fabricating a semiconductor device. According to at least this example embodiment, the method may include: forming a plurality of word lines extending in a first direction in or on a substrate; forming a first separation pattern crossing over the plurality of word lines; forming a buried insulation layer filling spaces between the first separation pattern; patterning the buried insulation layer to form a bit line node hole; recessing an upper portion of the buried insulation layer to expose upper sidewalls of the first separation pattern; forming a plurality of spacers covering the upper sidewalls of the first separation pattern and a sidewall of the bit line node hole; and forming a bit line and a bit line node contact, the bit line being between portions of the first separation pattern on the buried insulation layer, and the bit line node contact being in the bit line node hole.

According to at least some example embodiments, the first separation pattern may be formed of a conductive material. In this case, the method may further include: removing a portion of the first separation pattern to form a storage node contact having a plug shape.

The first separation pattern may be formed of an insulating material. In this case, the method may further include: removing a portion of the first separation pattern to form a storage node hole; and forming a storage node contact in the storage node hole.

According to at least some example embodiments, the method may further include: removing the first separation pattern; and forming a storage node contact in a part of a region where the first separation pattern is removed.

Before forming the first separation patterns, the method may further include: forming a capping pattern on each of the plurality of word lines, the capping pattern protruding from the substrate; forming a second separation pattern between adjacent portions of the capping pattern on the substrate; and forming a storage node pad between portions of the second separation pattern and between portions of the capping pattern, the storage node pad being connected to the substrate. In this case, forming the bit line node hole may include: removing a portion of the storage node pad and a portion of the second separation pattern.

According to at least some example embodiments, forming the spacers may include: forming a sacrificial spacer covering the sidewall of the bit line node hole; forming an outer spacer covering a sidewall of the sacrificial spacer; and removing the sacrificial spacer to form an air gap. The sacrificial spacer may be formed of a hydrocarbon layer. In this case, removing the sacrificial spacer may include: performing an ashing process to decompose the sacrificial spacer.

BRIEF DESCRIPTION OF THE DRAWINGS

Inventive concepts will become more apparent in view of the attached drawings and accompanying detailed description.

DETAILED DESCRIPTION

Figure 1A:
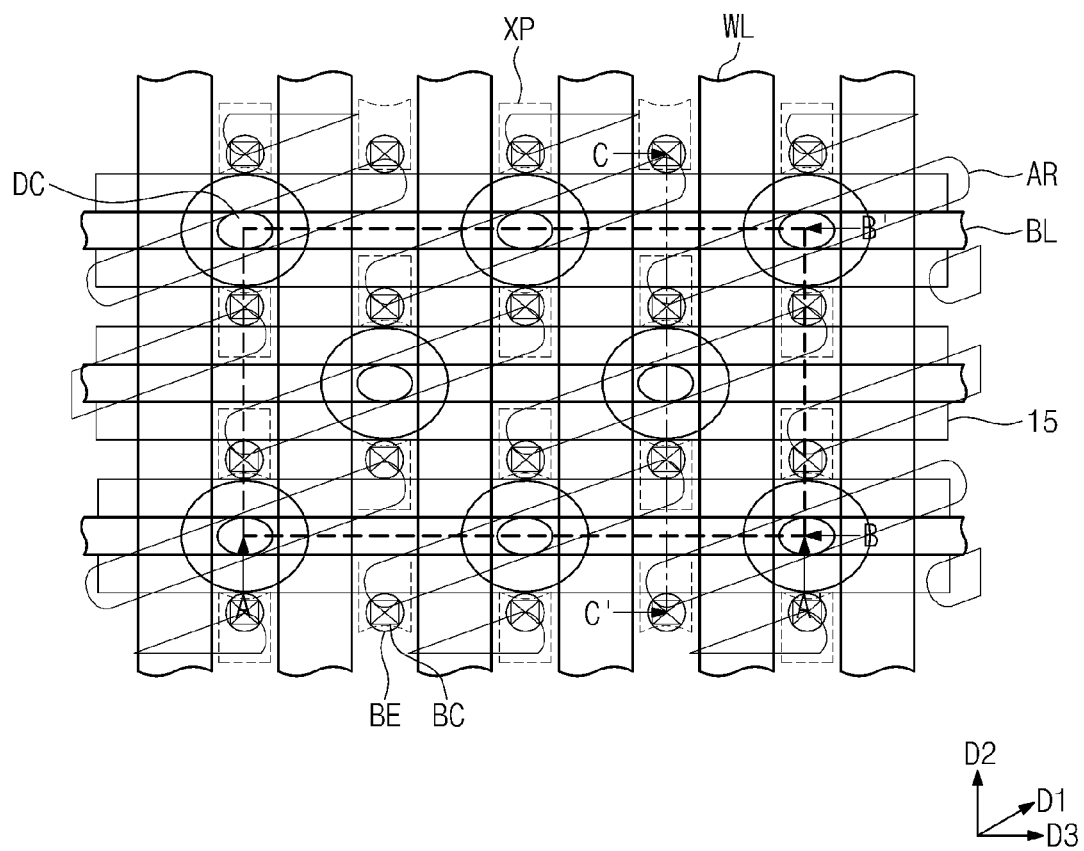
FIG. 1A is a layout illustrating a semiconductor device according to example embodiments of inventive concepts.

Inventive concepts will now be described more fully hereinafter with reference to the accompanying drawings, in which example embodiments of inventive concepts are shown. The advantages and features of inventive concepts and methods of achieving them will be apparent from the following example embodiments that will be described in more detail with reference to the accompanying drawings. It should be noted, however, that inventive concepts is not limited to the following example embodiments, and may be implemented in various forms. Accordingly, the example embodiments are provided only to disclose inventive concepts and let those skilled in the art know the category of inventive concepts. In the drawings, embodiments of inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description will be described with sectional views as ideal example views of inventive concepts. Accordingly, shapes of the example views may be modified according to manufacturing techniques and/or allowable errors. Therefore, example embodiments of inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concept explained and illustrated herein include their complementary counter parts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
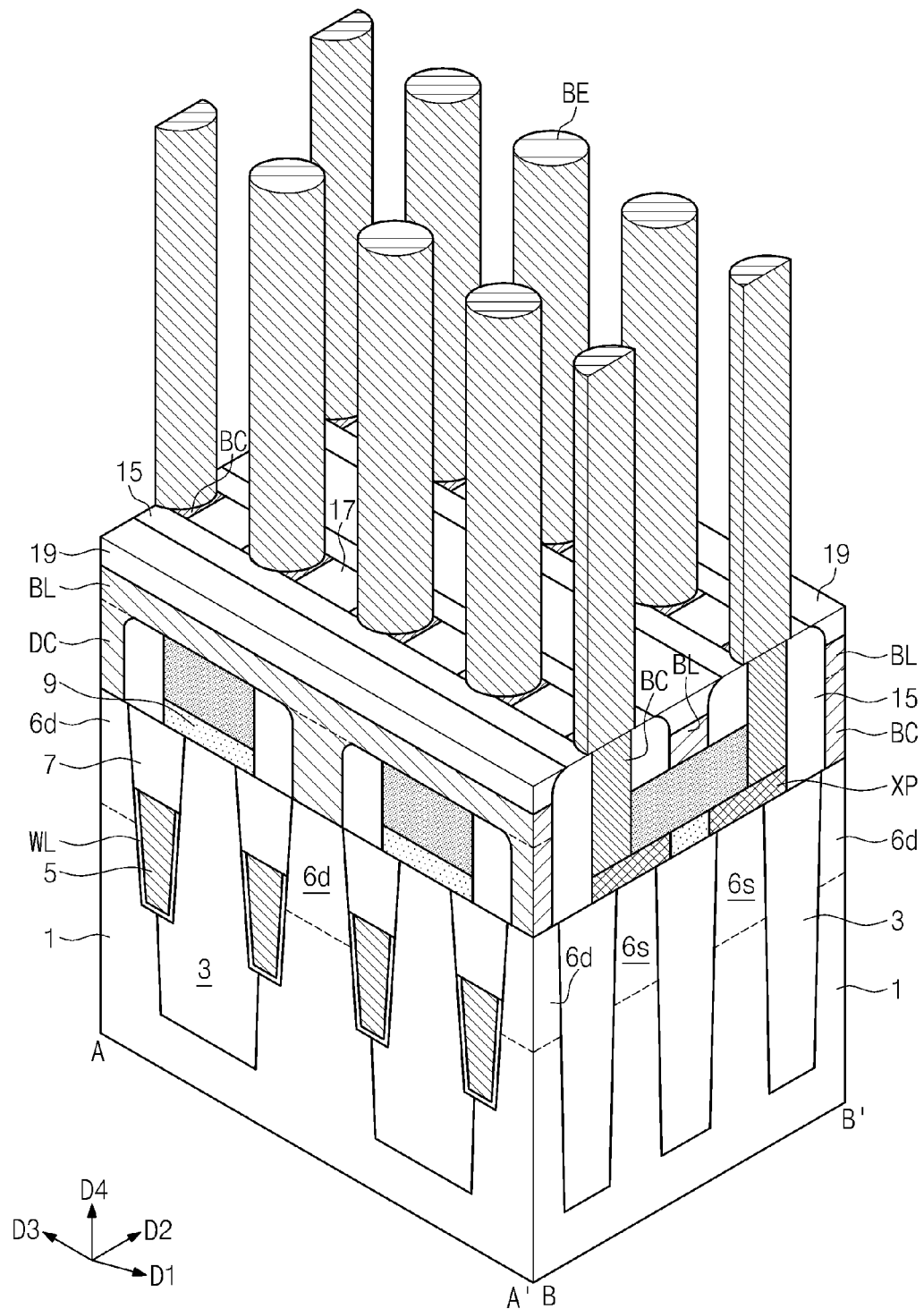
FIG. 1B is a perspective view illustrating a portion of FIG. 1A.
Figure 1C:
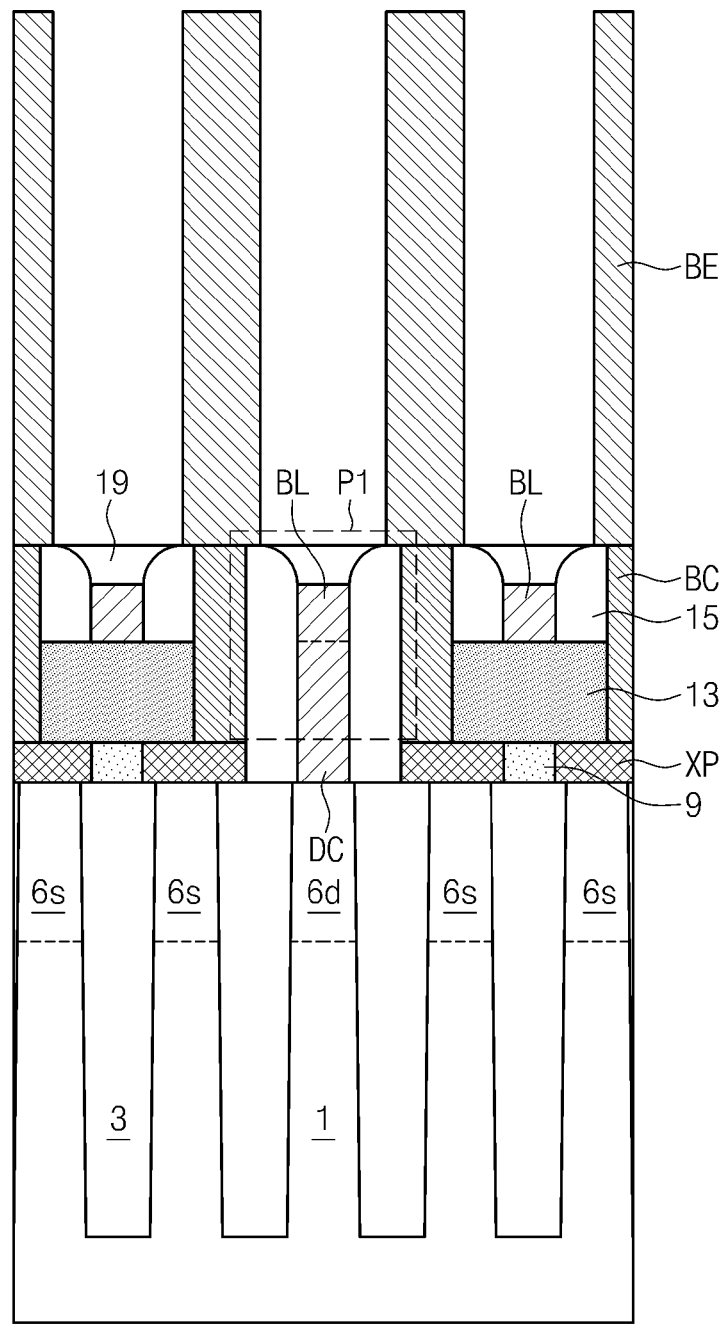
FIG. 1C is a cross-sectional view taken along a line C-C' of FIG. 1A.

FIG. 1A is a layout illustrating a semiconductor device according to example embodiments of inventive concepts. FIG. 1B is a perspective view illustrating a portion of FIG. 1A. In particular, FIG. 1B is a perspective view taken along lines A-A' and B-B' of FIG. 1A. FIG. 1C is a cross-sectional view taken along a line C-C' of FIG. 1A.

Referring to FIGS. 1A, 1B, and 1C, a device isolation layer 3 may be disposed in or on a substrate 1 to define active regions AR. Each of the active regions AR may have a long bar shape in a first direction D1 when viewed from a top view. The active regions AR may be disposed in parallel to each other. A center of one active region AR may be adjacent to an end portion of another active region AR adjacent thereto. A plurality of word lines WL may be disposed in the substrate 1 to cross the active regions AR and the device isolation layer 3. The plurality of word lines WL may extend in a second direction D2. The word lines WL may include at least one of doped poly-silicon, a metal silicide, and a metal. The second direction D2 crosses the first direction D1. Top surfaces of the word lines WL may be disposed to be lower than a top surface of the substrate 1. A gate insulation layer 5 is disposed between the substrate 1 and each of the word lines WL. A first dopant injection region 6s may be disposed in the substrate 1 at a side of the word line WL, and a second dopant injection region 6d is disposed in the substrate 1 at another side of the word line WL.

A first capping pattern 7 may be disposed on each of the word lines WL. At least a portion of the first capping pattern 7 may protrude from the top surface of the substrate 1 as illustrated in FIGS. 4B to 9B. In other words, a top surface of the protruding portion of the first capping pattern 7 may be higher than the top surface of the substrate 1. The first capping pattern 7 may be formed of, for example, silicon nitride and/or silicon oxynitride. Storage node pads XP, which are connected to the first dopant injection regions 6s, respectively, may be disposed between portions of the first capping pattern (also referred to as between the first capping patterns) 7 adjacent to each other. Additionally, a first separation pattern 9 contacting the device isolation layer 3 may be disposed between adjacent storage node pads XP disposed between the first capping patterns 7 adjacent to each other. The first separation pattern 9 may be formed of the same material as the device isolation layer 3. A top surface of the first separation pattern 9 may be substantially coplanar with top surfaces of the storage node pads XP and the top surface of the protruding portion of the first capping pattern 7.

The storage node pads XP are spaced apart from each other by the first separation pattern 9. A planar shape of the storage node pad XP may be similar to a quadrilateral shape. However, a portion of the storage node pad XP, which is adjacent to a bit line node contact DC, may be curved.

An area of a bottom surface of the storage node pad XP according to at least some example embodiment of inventive concepts is larger than an area of a bottom surface of a conventional storage node pad having a circular cylindrical shape. Thus, a contact area between the storage node pad XP and the active region AR in the structure of at least some example embodiment may be about 1.37 times larger than that of a conventional structure having the conventional storage node pad having the circular cylindrical shape. As a result, a contact resistance between the storage node pad XP and the first dopant injection region 6s may be reduced.

In at least this example embodiment, since the word lines WL are disposed in the substrate 1, a cell transistor has a recessed channel region. Thus, a short channel effect characteristic may be improved to reduce and/or minimize a leakage current in a more highly integrated semiconductor device.

A bit line BL may be disposed on the substrate 1. The bit line BL may extend in a third direction D3 crossing the first and second directions D1 and D2 when viewed from a top view. The bit line BL may vertically overlap with the first separation patterns 9. The bit line BL may include a metal containing layer. The bit line BL is electrically connected to the second dopant injection region 6d through the bit line node contact DC. The bit line node contact DC may include at least one of a metal silicide, doped poly-silicon, a metal nitride, and a metal. The bit line BL may have a width substantially equal to that of the bit line node contact DC. A sidewall of the bit line BL may be aligned with a sidewall of the bit line node contact DC. A first buried insulation layer 13 may be disposed between the bit line BL and the first separation pattern 9 beside the bit line node contact DC. The first buried insulation layer 13 may also be disposed between a portion of the bit line BL and a portion of the storage node pad XP.

Storage node contacts BC may be disposed between the bit lines BL. The storage node contacts BC may be in contact with the storage node pads XP, respectively. A second buried insulation layer 17 may be disposed between the storage node contacts BC adjacent to each other. The storage node contact BC may have a sidewall laterally aligned with a sidewall of the second buried insulation layer 17.

The storage node contact BC may include at least one of a metal silicide, doped poly-silicon, a metal nitride, and a metal. The storage node contact BC may have a sidewall vertically aligned with a sidewall of the first buried insulation layer 13. Distances between the storage node contacts BC and the bit lines BL may be uniform or substantially uniform regardless (or independent) of a position. As a result, the bit line BL and the bit line node contact DC may have the sidewalls aligned with each other and the distances between the bit lines BL and the storage node contacts BC may be uniform or substantially uniform, such that cell dispersion may be reduced and/or reliability of the semiconductor device may be improved.

Figure 2A:
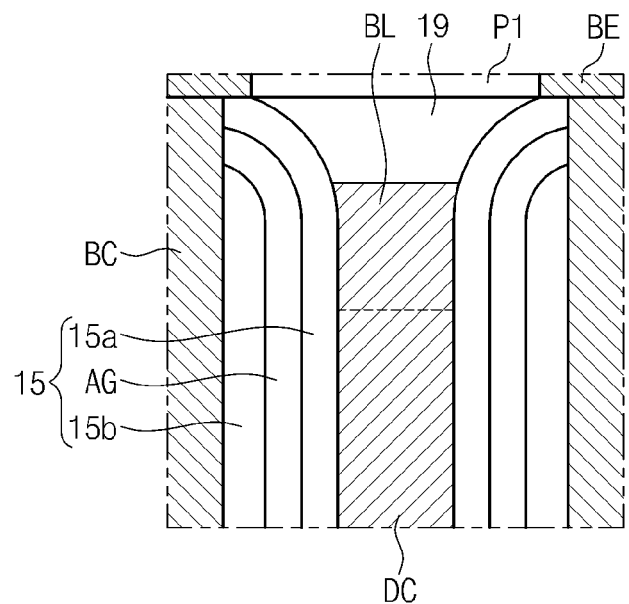
FIGS. 2A and 2B are enlarge views of a portion 'P1' of FIG. 1C according to example embodiments of inventive concepts.
Figure 2B:
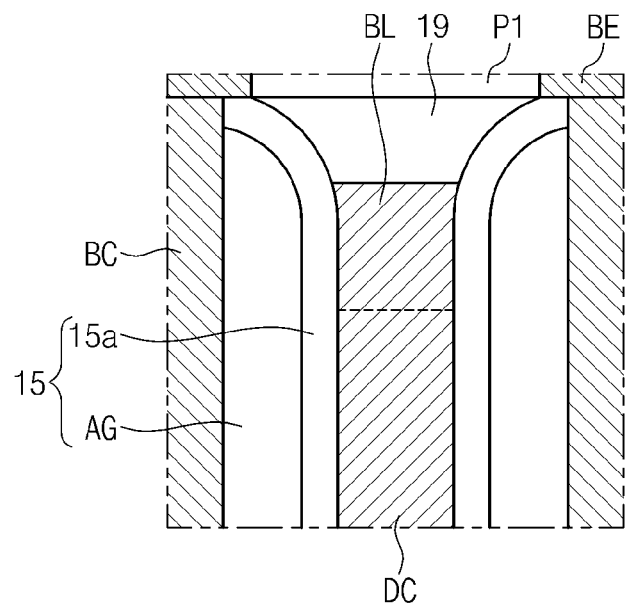

Referring to FIGS. 1A to 1C, 2A, and 2B, an insulation spacer 15 may be disposed between the bit line BL and the storage node contact BC, between the bit line node contact DC and the storage node contact BC, and between the bit line node contact DC and the storage node pad XP. The insulation spacer 15 may be formed of a single-layer or a multi-layer of an insulating material. In another example embodiment, the insulation spacer 15 may include an air gap AG. In this case, the insulation spacer 15 may include a triple-layer structure of an inner spacer 15b, the air gap AG, and an outer spacer 15a, as illustrated in FIG. 2A. The inner spacer 15b and the outer spacer 15a may be formed of an insulating material. Alternatively, the insulation spacer 15 may have a double layer structure of the air gap AG and the outer spacer 15a without the inner spacer 15b, as illustrated in FIG. 2B. Since the insulation spacer 15 includes the air gap AG therein, its insulating characteristic may be improved to suppress and/or prevent leakage current between the storage node contact BC and the bit line BL.

The widths of the storage node contact BC, the bit line BL, and the insulation spacer 15 may be equal or approximately equal to each other.

A second capping pattern 19 may be disposed on the bit line BL. The second capping pattern 19 may include the same or substantially the same material as the first capping pattern 7.

A data storage element may be disposed on the storage node contact BC. In at least this example embodiment, the data storage element may be a capacitor including a lower electrode BE, a dielectric layer (not shown), and an upper electrode (not shown), and the semiconductor device may be a dynamic random access memory (DRAM) device. The lower electrode BE may extend in a fourth direction D4 perpendicular or substantially perpendicular to the top surface of the substrate 1. The fourth direction D4 may be perpendicular or substantially perpendicular to the first, second and third directions D1, D2, and D3. Even though not shown in the drawings, a sidewall of the lower electrode BE may be in contact with a support pattern (not shown) for suppressing and/or preventing the lower electrode BE from leaning. The lower electrode BE may have a plug shape, a pillar shape, or a hollow cylindrical shape.

FIGS. 3A, 4A, 5A, 6A, 7A, 8A, 9A, 10A, and 11A are plan views illustrating an example embodiment of a method of fabricating a semiconductor device of FIG. 1A. FIGS. 3B, 4B, 5B, 6B, 7B, 7C, 8B, 9B, 9C, 10B, and 11B are perspective views illustrating an example embodiment of a method of fabricating a semiconductor device of FIG. 1B.

Figure 3A:
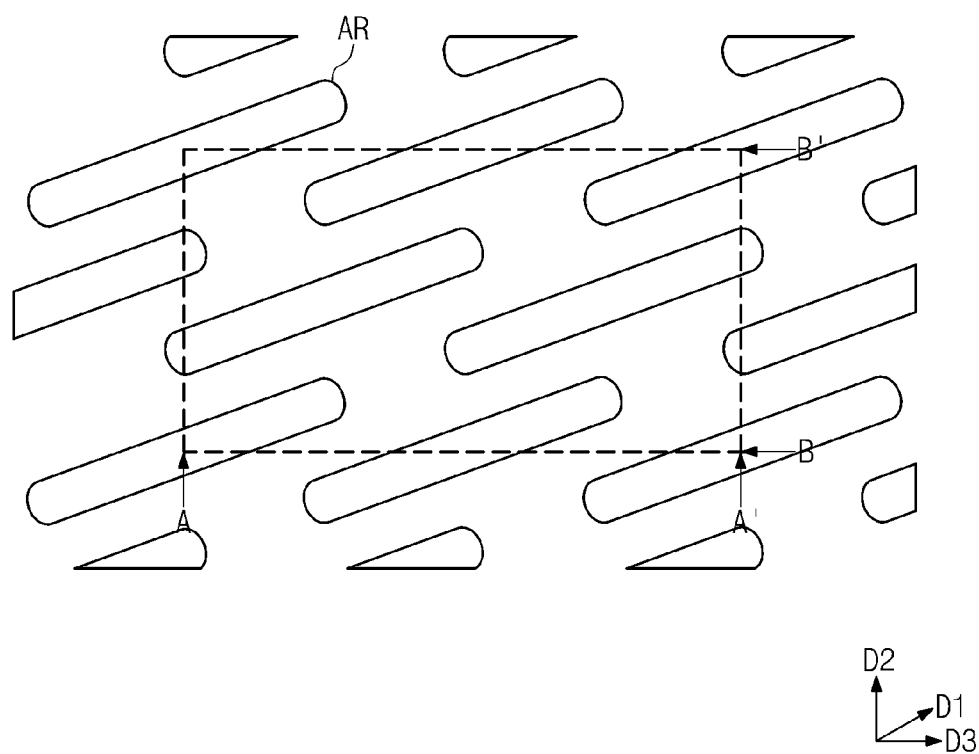
FIGS. 3A, 4A, 5A, 6A, 7A, 8A, 9A, 10A, and 11A are plan views illustrating an example embodiment of a method of fabricating a semiconductor device of FIG. 1A.
Figure 3B:
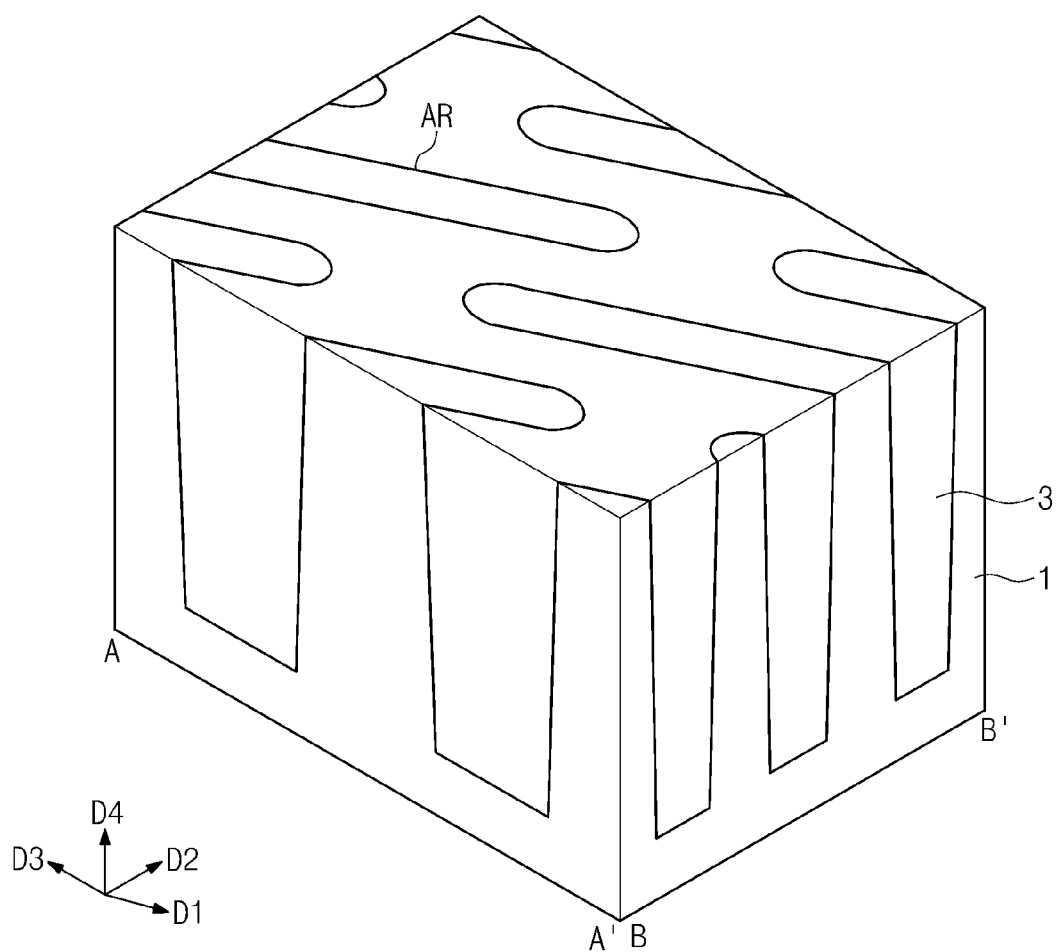
FIGS. 3B, 4B, 5B, 6B, 7B, 7C, 8B, 9B, 9C, 10B, and 11B are perspective views illustrating an example embodiment of a method of fabricating a semiconductor device of FIG. 1B.

Referring to FIGS. 3A and 3B, a device isolation layer 3 may be formed in or on a substrate 1 to define active regions AR. For example, the substrate 1 may be a silicon wafer substrate or a silicon-on-insulator (SOI) substrate. The device isolation layer 3 may be formed by, for example, a shallow trench isolation (STI) method. The device isolation layer 3 may be formed of at least one of, for example, a silicon oxide layer, a silicon nitride layer, and a silicon oxynitride layer.

Figure 4A:
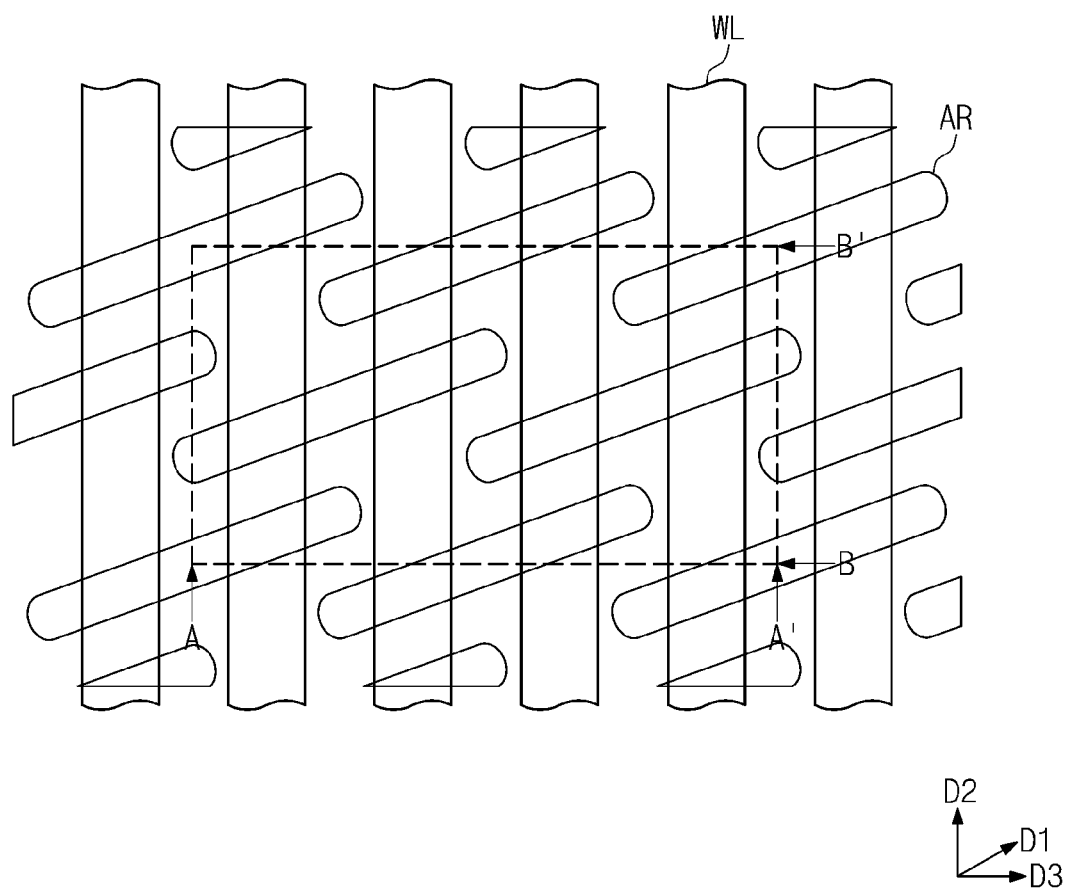
Figure 4B:
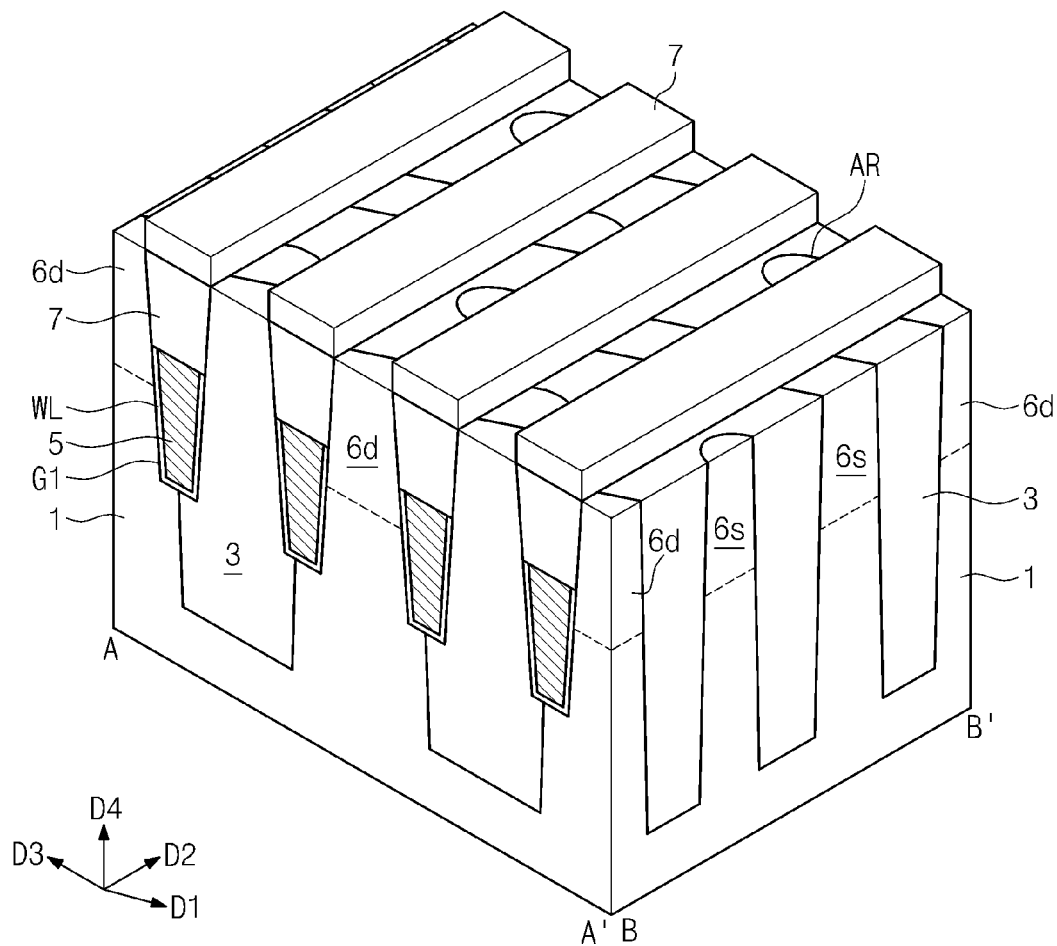

Referring to FIGS. 4A and 4B, first mask patterns (not shown) of line shapes extending in the second direction D2 may be formed on the substrate 1, and then the device isolation layer 3 and the substrate 1 of the active regions AR may be etched using the first mask patterns (not shown) as etch masks to form first grooves G1. At this time, an etch recipe may be controlled in such a way that an etch rate of the device isolation layer 3 is greater than an etch rate of the substrate 1. Thus, a bottom surface of the first groove G1 may be uneven. A gate insulation layer 5 may be formed on the substrate 1 exposed by the first grooves G1. The gate insulation layer 5 may be formed of, for example, a thermal oxide layer. A conductive layer may be formed in the first groove G1 having the gate insulation layer 5, and then may be recessed to form a word line WL in each of the first grooves G1.

A first capping pattern 7 may be formed on each of the word lines WL in each of the first grooves G1. For example, the first capping pattern 7 may be formed of a silicon nitride layer and/or silicon oxynitride layer. For the formation of the first capping pattern 7, an insulating capping layer may be deposited to fill the first groove G1, and then the deposited insulating capping layer may be planarized until the first mask patterns (not shown) are exposed. A top surface of the first capping pattern 7 may protrude upward to be higher than the top surface of the substrate 1. After the first capping pattern 7 is formed, the first mask patterns (not shown) may be removed to expose a protruding sidewall of the first capping pattern 7 and top surfaces of the device isolation layer 3 and the substrate 1 of the active region AR. An ion implantation process may be performed to form a first dopant injection region 6s and a second dopant injection region 6d in the exposed substrate 1 of the active region AR. The first and second dopant injection regions 6s and 6d may be doped with dopants of the same conductivity type, for examples, N-type dopants. A depth of the first dopant injection region 6s may be different from that of the second dopant injection region 6d. To achieve this, a plurality of ion implantation processes may be performed.

Figure 5A:
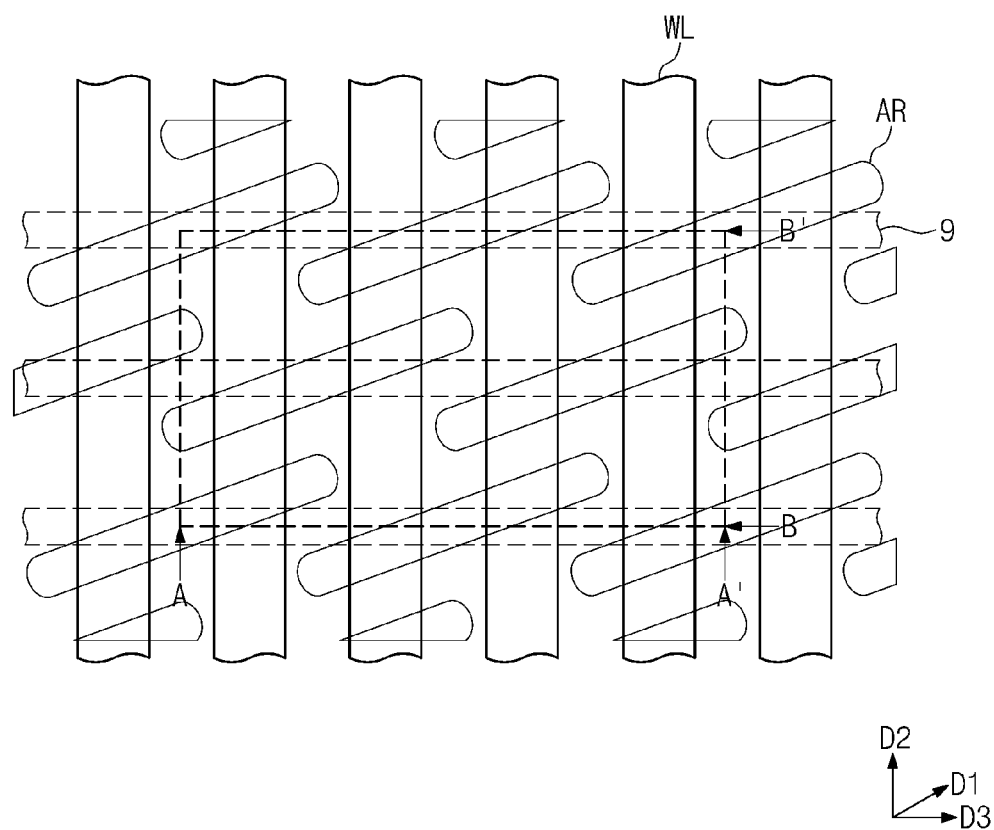
Figure 5B:
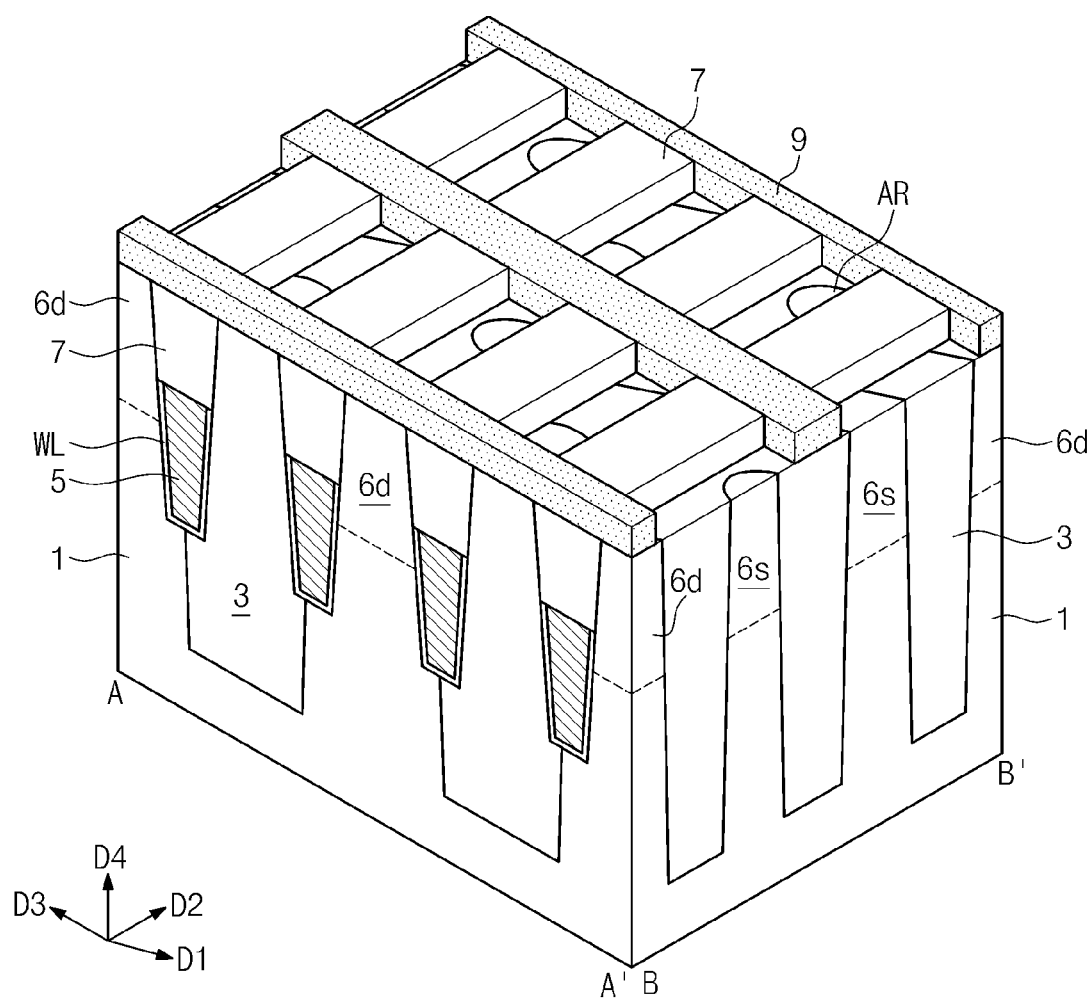

Referring to FIGS. 5A and 5B, a first separation pattern 9 crossing the first capping pattern 7 may be formed on the substrate 1. The first separation pattern 9 may be formed of a silicon nitride layer and/or a silicon oxynitride layer. A second mask pattern (not shown) including openings having shapes of the first separation pattern 9 may be formed on the resultant structure of FIGS. 4A and 4B, and then portions of the first capping pattern 7 may be removed using the second mask pattern (not shown). The first separation pattern 9 may be formed in the openings, respectively, and then the second mask pattern (not shown) may be removed. Thus, the device isolation layer 3 and the substrate 1 between the first capping patterns 7 and between the first separation patterns 9 may be exposed.

The first mask pattern (not shown) and the second mask pattern (not shown) may be formed using a double patterning technology. Since the double patterning technology is used, it is possible to realize mask patterns having widths smaller than widths defined by a photolithography process using an ArF and/or KrF light source, without an expensive photolithography process using an extreme ultraviolet (EUV) light source.

Figure 6A:
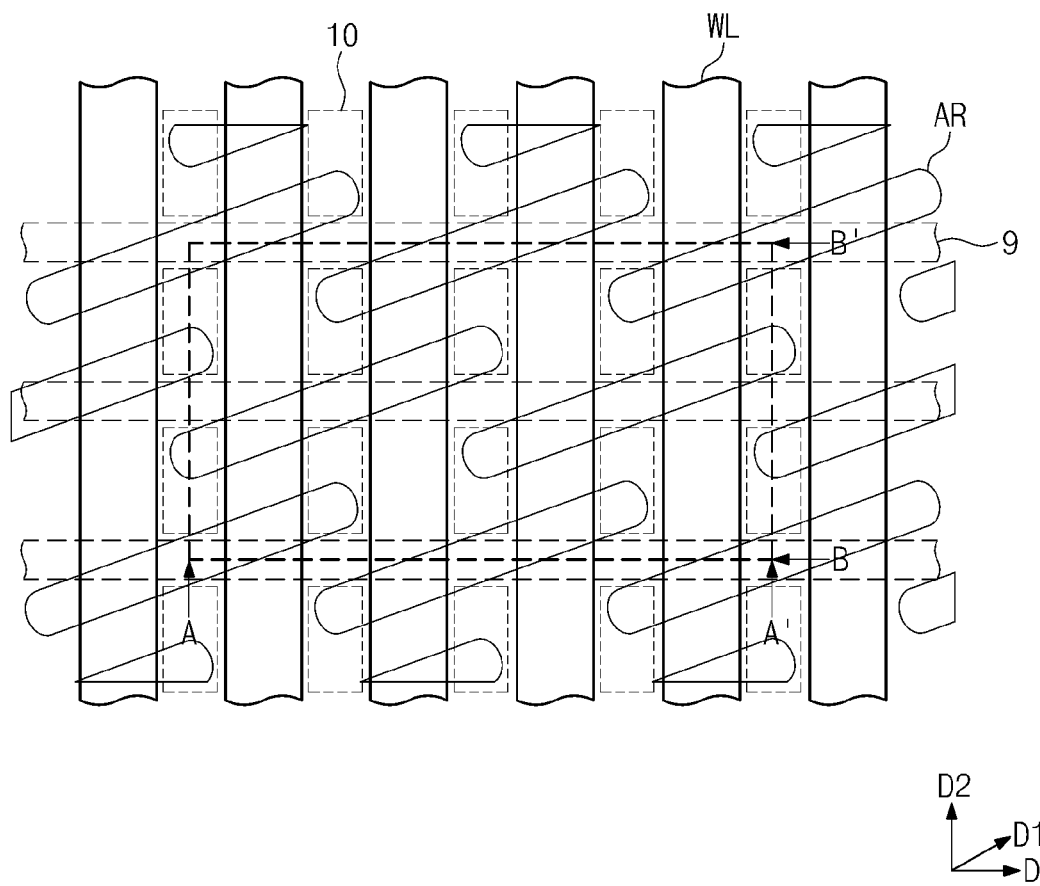
Figure 6B:
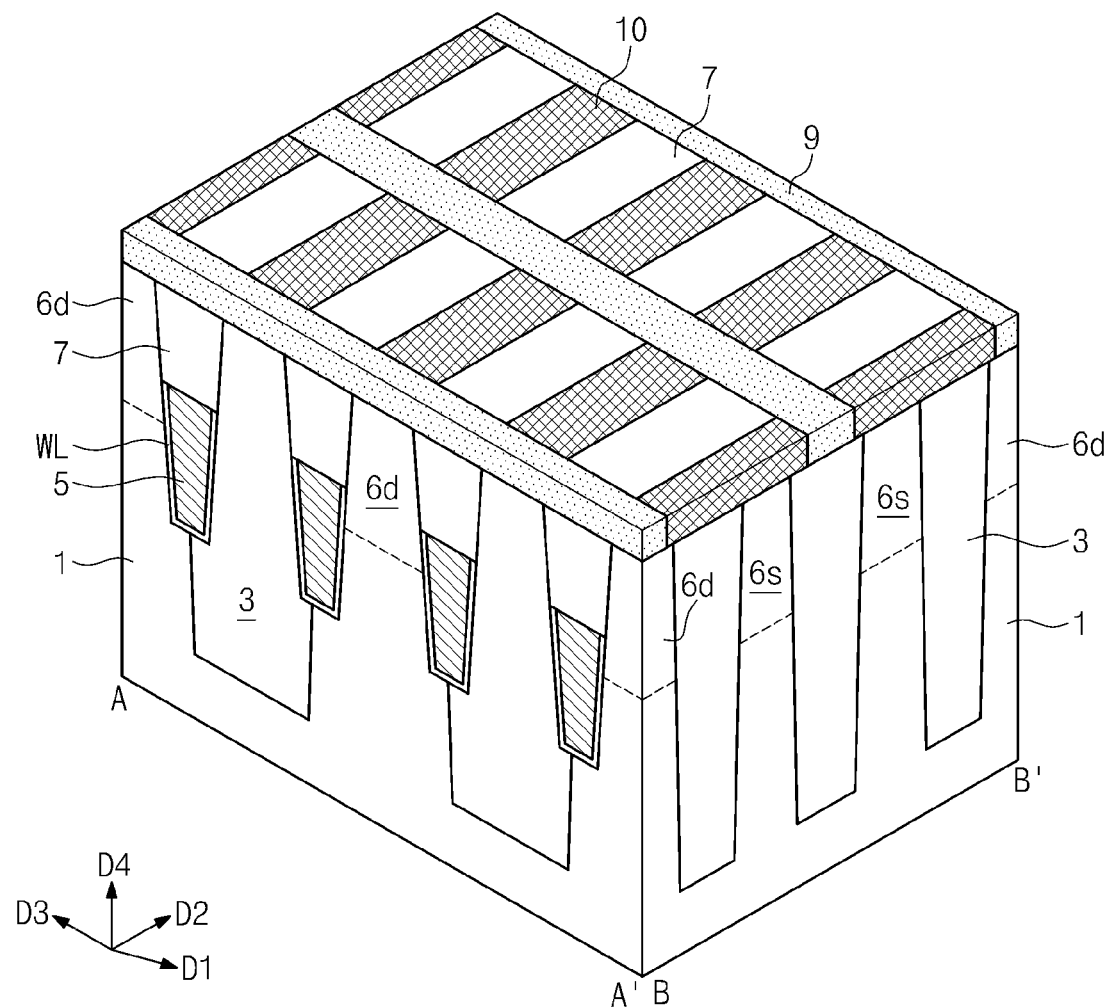

Referring to FIGS. 6A and 6B, a conductive layer may be formed on the substrate 1 and then a planarization process may be performed on the conductive layer until the top surfaces of the first capping pattern 7 and the first separation pattern 9 are exposed. Thus, preliminary storage node pads 10 contacting the substrate 1 may be formed between portions of the first capping pattern 7 (also referred to as between the first capping patterns 7) and between portions of the first separation pattern (also referred to as between the first separation patterns) 9. The conductive layer for the preliminary storage node pads 10 may be formed of, for example, a doped polysilicon layer. The preliminary storage node pad 10 may be formed to connect the first and second dopant injection regions 6s and 6d to each other. Since the preliminary storage node pad 10 is formed to be self-aligned with the first capping pattern 7 and the first separation patterns 9, misalignment of the preliminary storage node pad 10 may be suppressed and/or prevented. For suppressing and/or preventing a void from being formed in the preliminary storage node pad 10, a deposition process and an etching process may be repeatedly performed to form the conductive layer.

Figure 7A:
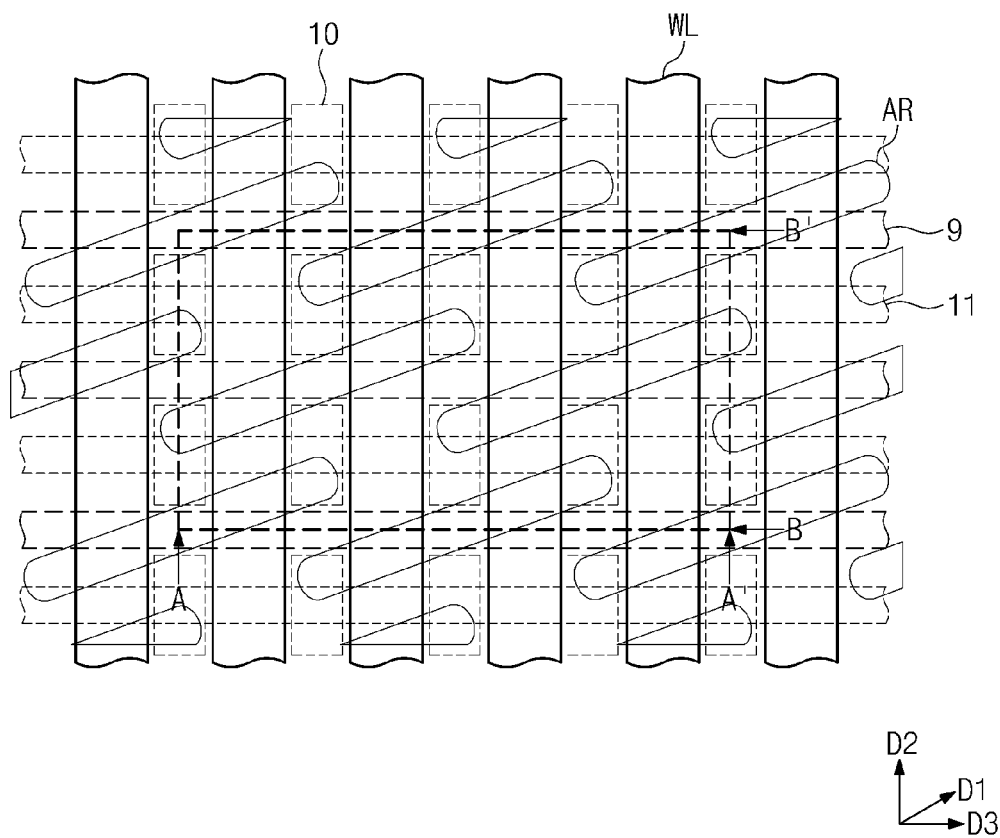
Figure 7B:
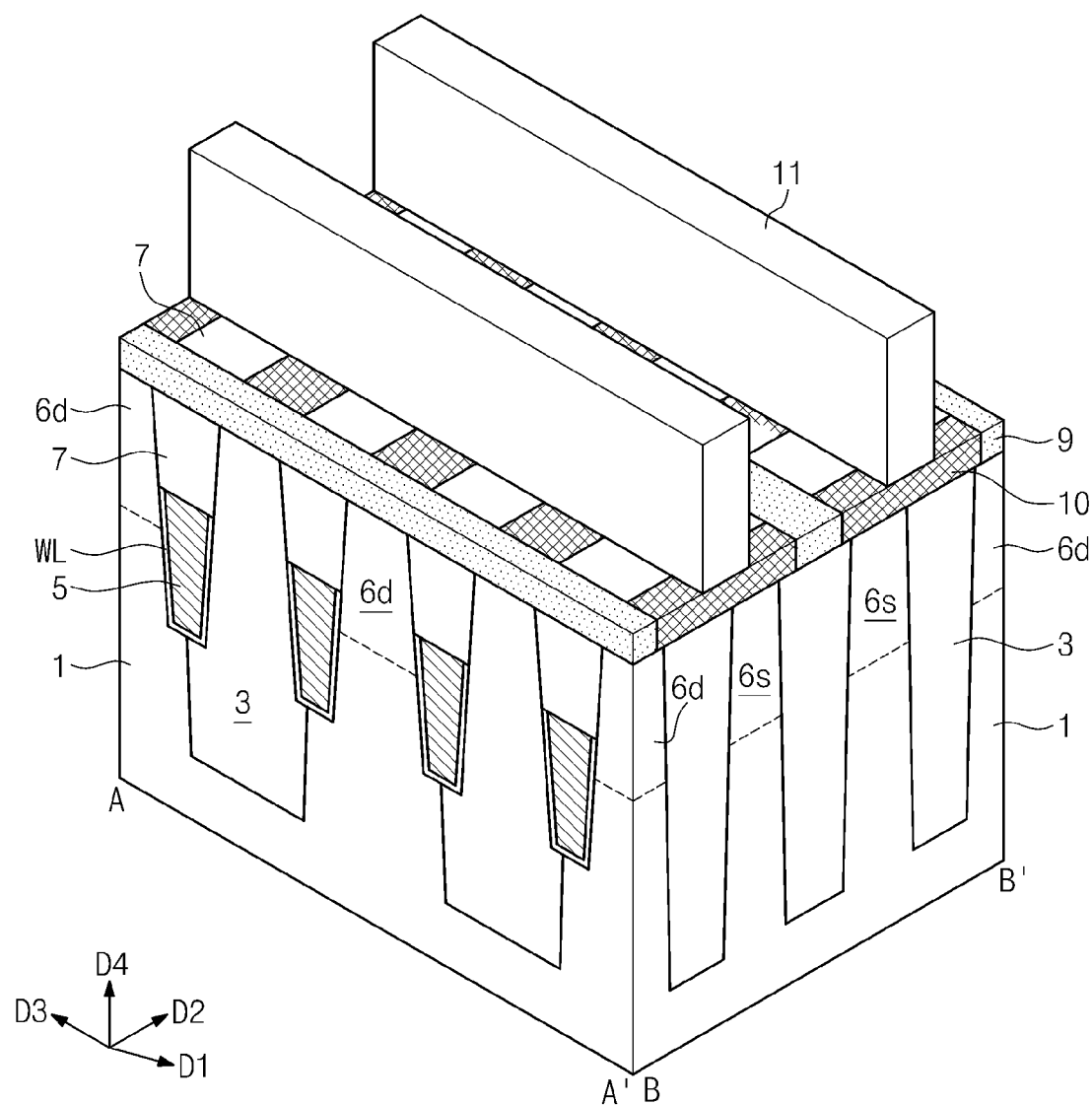

Referring to FIGS. 7A and 7B, a second separation pattern 11 may be formed to cross over the first capping pattern 7 and the preliminary storage node pads 10 between the first separation patterns 9. The second separation pattern 11 may be formed of a conductive material or an insulating material. The second separation pattern 11 may be formed of a material having an etch selectivity with respect to the first separation pattern 9, the preliminary storage node pads 10 and the first capping pattern 7. The second separation pattern 11 may be formed using a double patterning technology. Thus, the second separation pattern 11 may be realized by a photolithography process using an ArF and/or KrF light source, not a EUV light source. As a result, fabrication costs of the semiconductor device may be reduced.

Figure 7C:
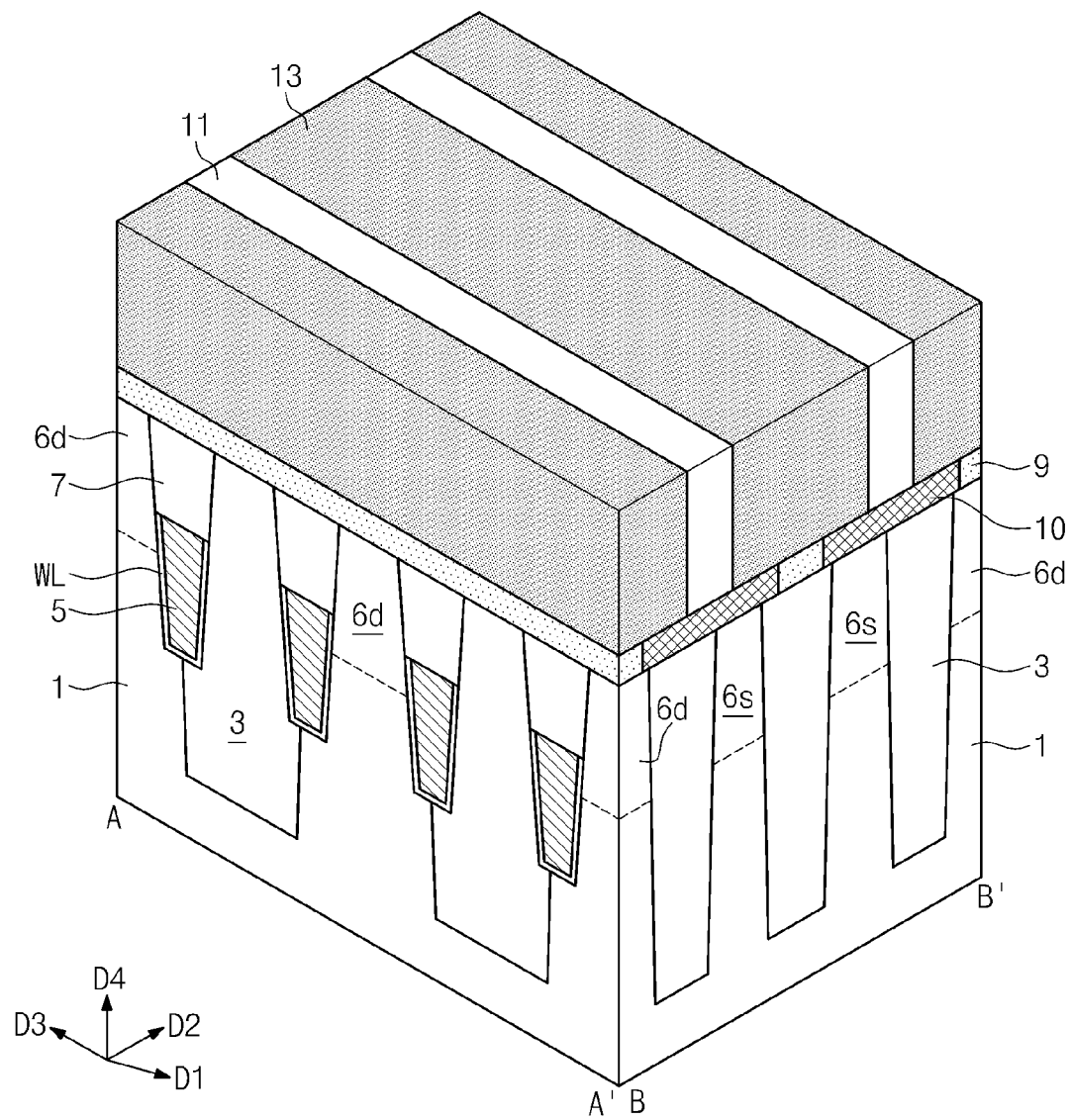

Referring to FIGS. 7A and 7C, a first buried insulation layer 13 may be formed to fill a space between portions of the second separation pattern 11 (also referred to as between the second separation patterns 11). The first buried insulation layer 13 may be formed of an insulating material having an etch selectivity with respect to the second separation pattern 11.

In the method described above, after the second separation pattern 11 is formed, the first buried insulation layer 13 may be formed. Alternatively, after the first buried insulation layer 13 is formed, the second separation pattern 11 may be formed.

Figure 8A:
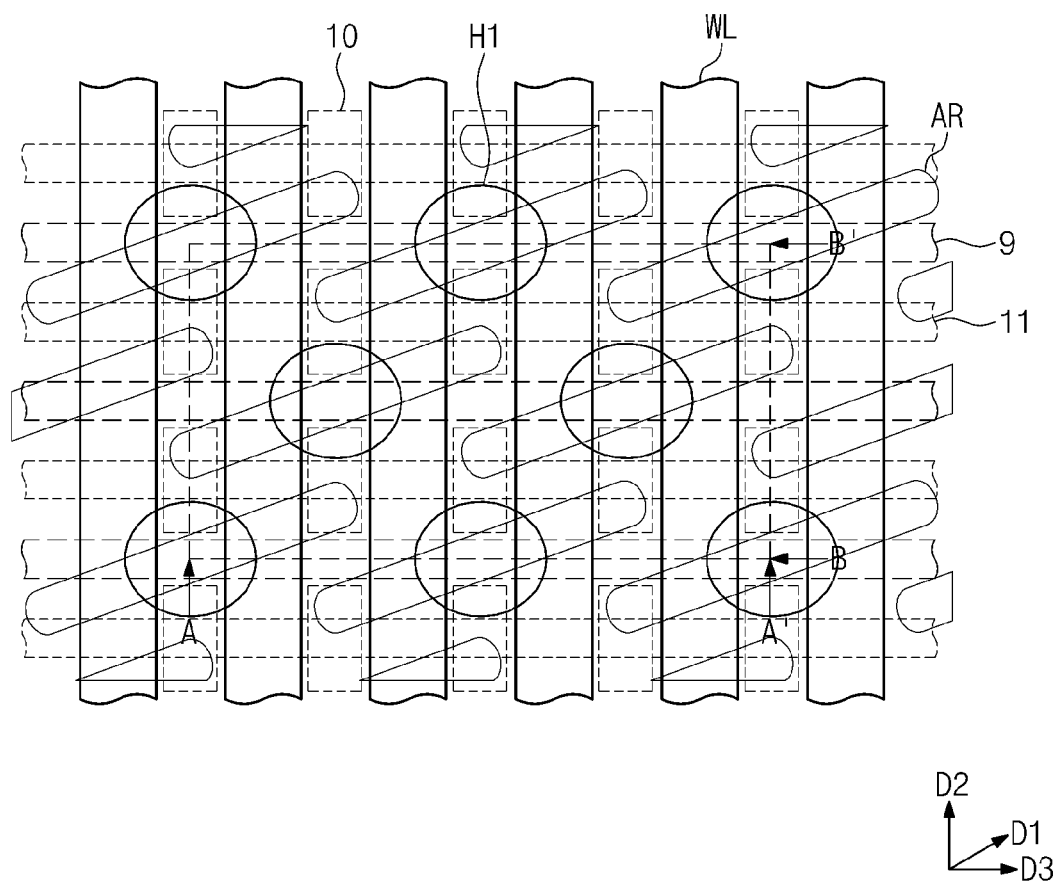
Figure 8B:
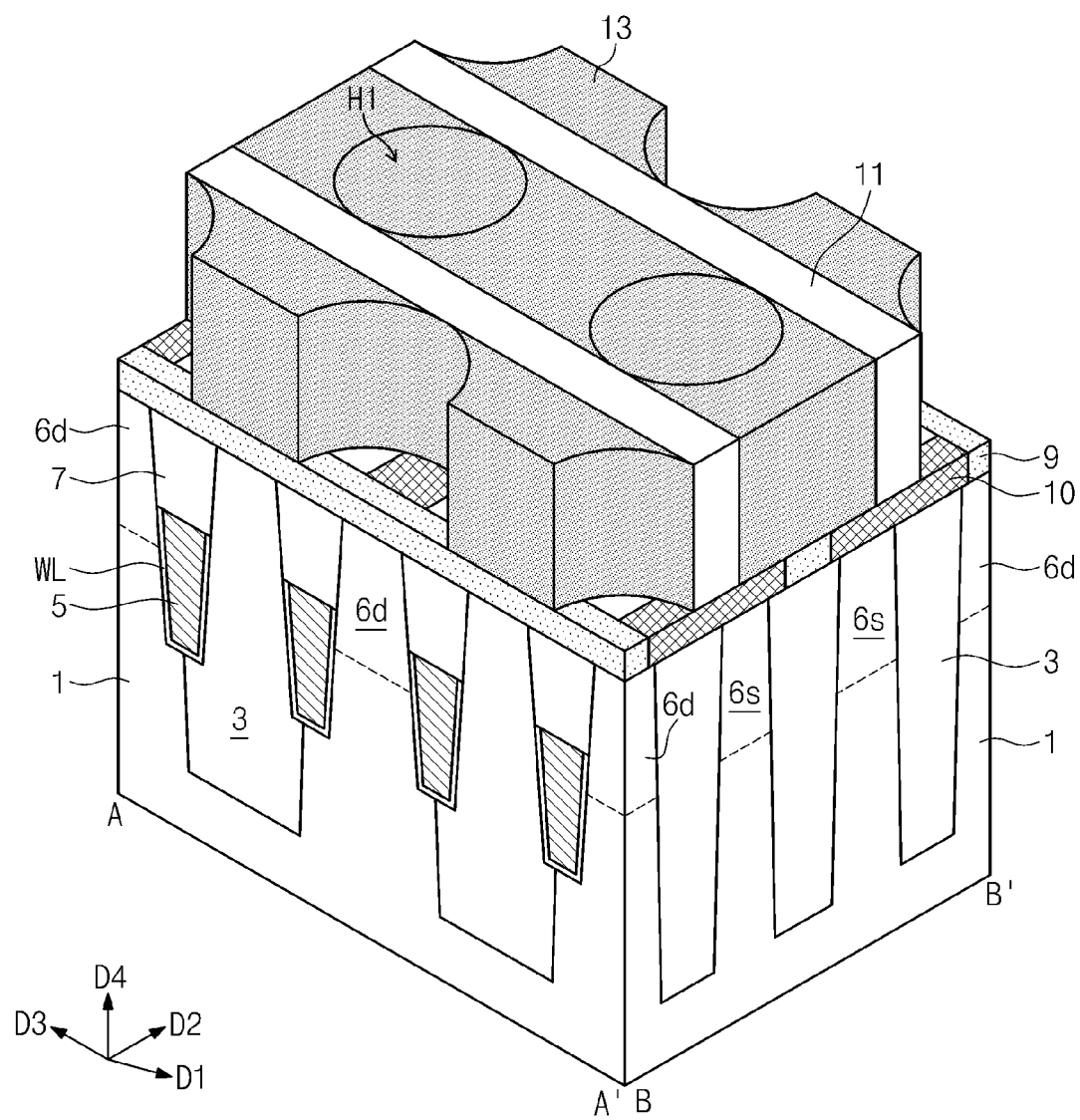

Referring to FIGS. 8A and 8C, the first buried insulation layer 13 may be patterned to form bit line node holes H1. The bit line node hole H1 may partially expose top surfaces of the first separation pattern 9, the first capping pattern 7, and the preliminary storage node pad 10. Additionally, a sidewall of the second separation pattern 11 may be partially exposed by the bit line node hole H1. The second separation pattern 11 may suppress and/or prevent the bit line node hole H1 from being enlarged into an undesired region. Thus, a bridge problem between bit line node contacts may be suppressed and/or prevented.

The bit line node hole H1 may be formed to have a desired diameter by one anisotropic etching process. Alternatively, a preliminary bit line node hole may be formed to have a diameter smaller than the desired diameter by an anisotropic etching process, and then the preliminary bit line node hole may be enlarged by an isotropic etching process to form the bit line node hole H1. The bit line node holes H1 may be formed to overlap with the second dopant injection region 6d.

Figure 9A:
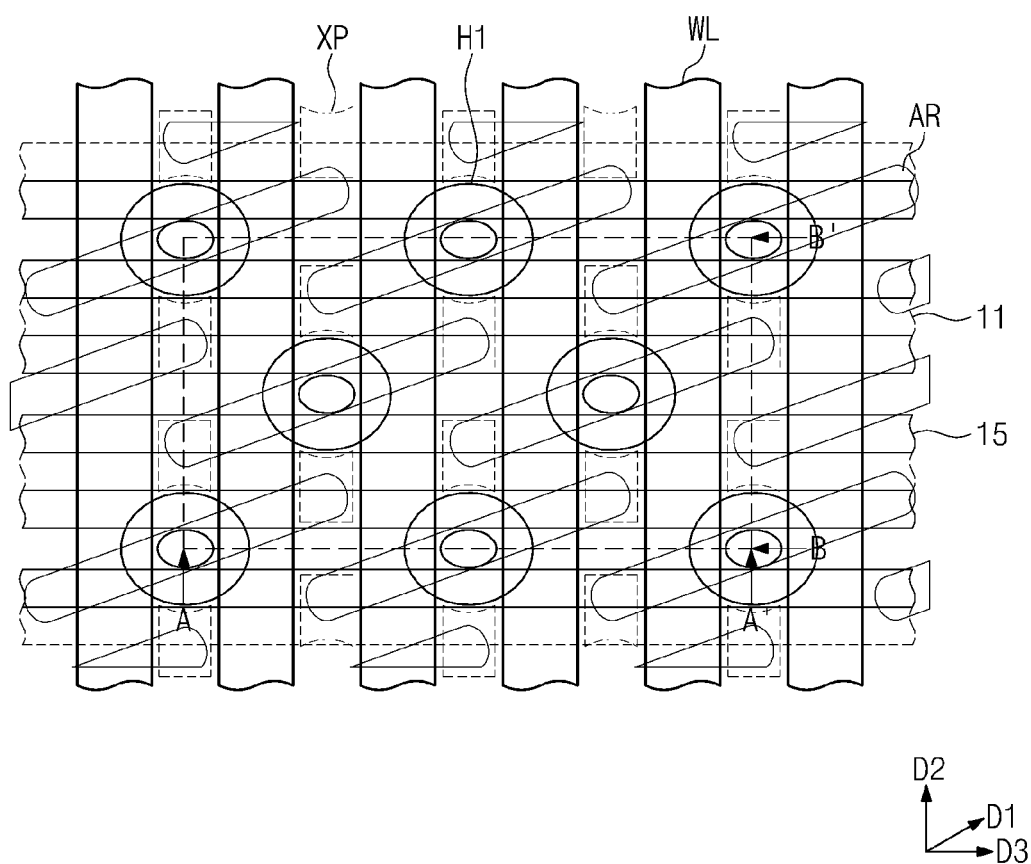
Figure 9B:
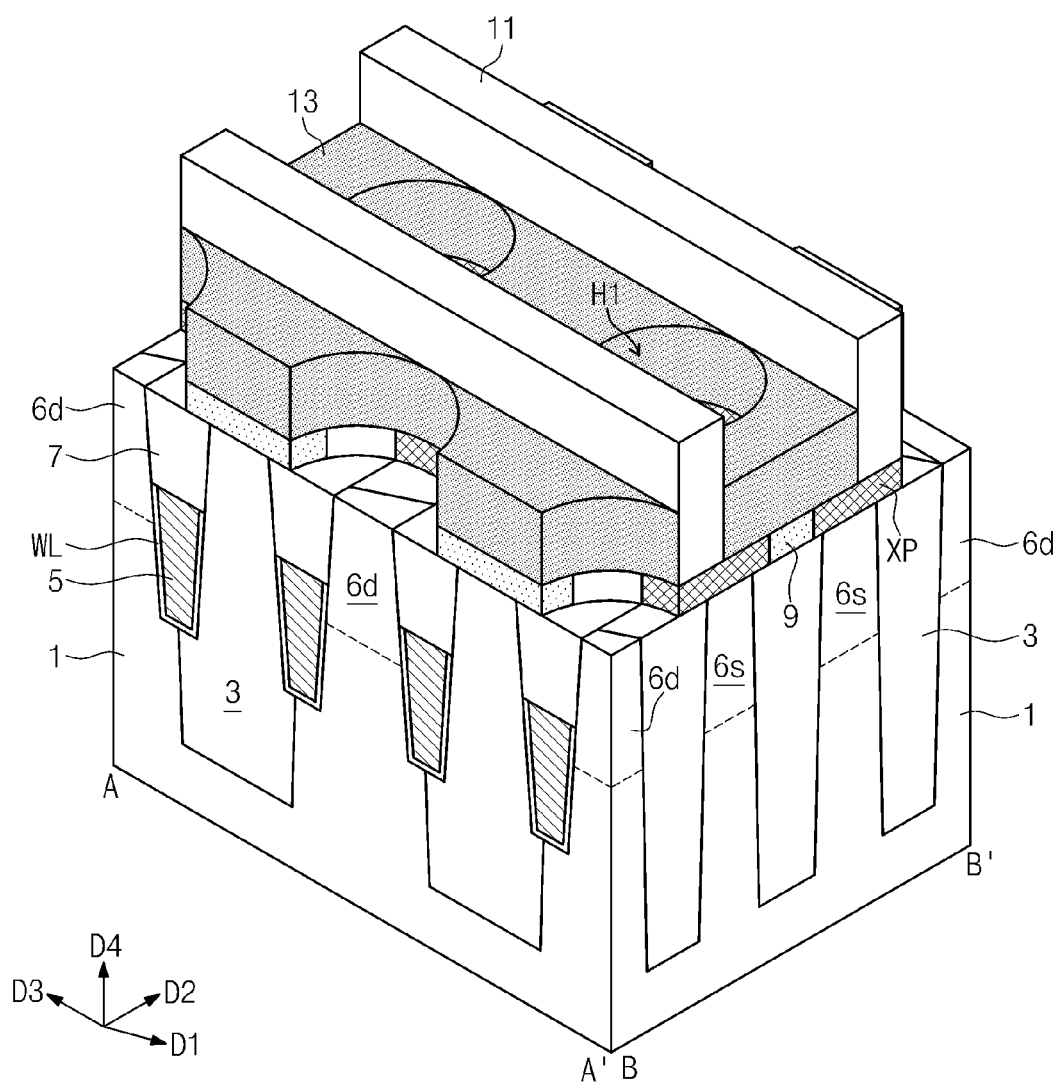

Referring to FIGS. 9A and 9B, the first separation pattern 9 and the preliminary storage node pad 10 exposed by the bit line node hole H1 may be removed to expose the top surface of the second dopant injection region 6d. Thus, the portion of the preliminary storage node pad 10 may be removed to form a storage node pad XP. The storage node pad XP is in contact with the first dopant injection region 6s, but is not in contact with the second dopant injection region 6d. The storage node pad XP may have, for example, four sides, and one of the four sides of the storage node pad XP may constitute a portion of a rounded sidewall of the bit line node hole H1. The first capping pattern 7 may be partially removed during the formation of the bit line node hole H1. At this time, an upper portion of the first buried insulation layer 13 may be recessed to expose an upper sidewall of the second separation pattern 11.

Figure 9C:
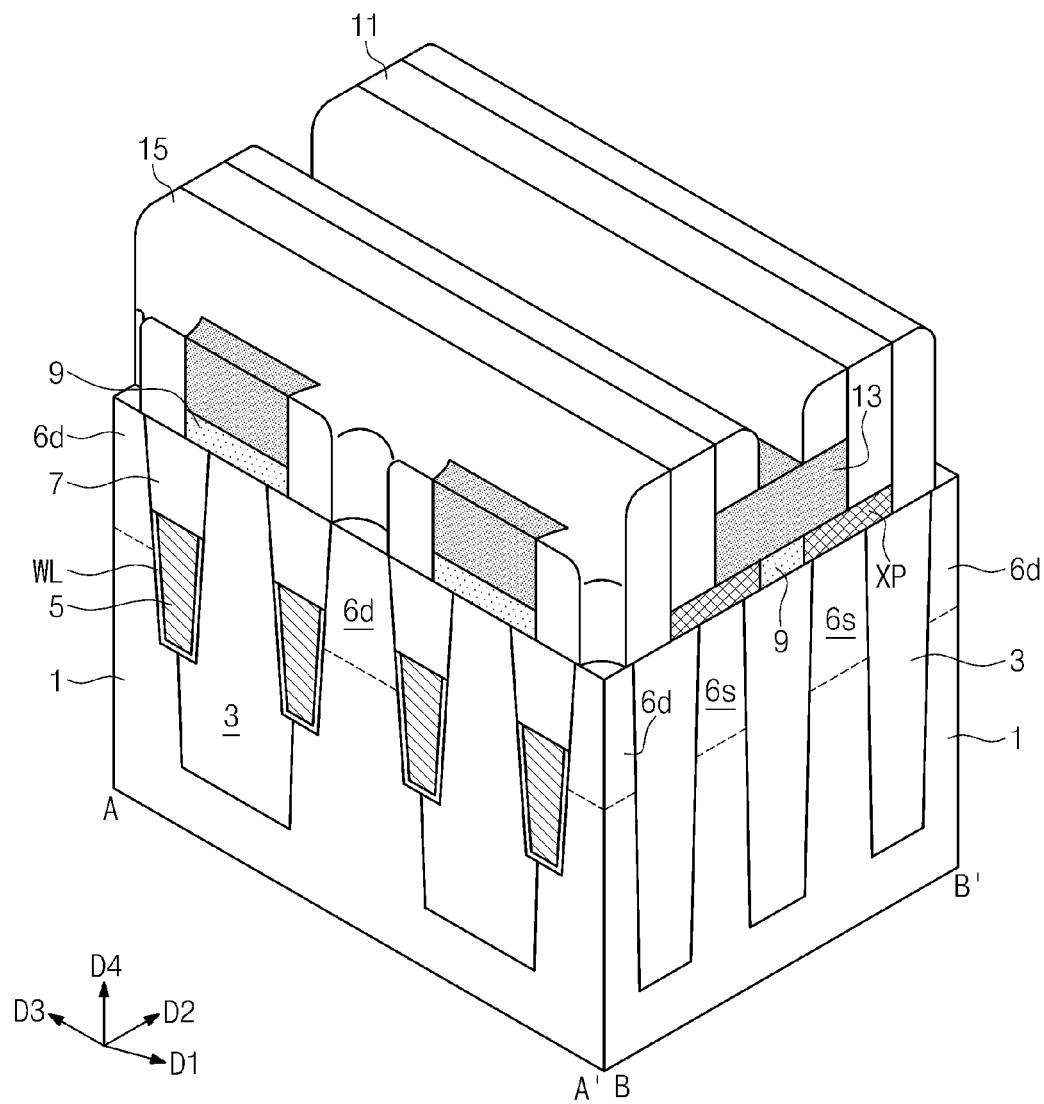

Referring to FIGS. 9A and 9C, a spacer layer may be conformally formed on the substrate 1 of the resultant structure of FIG. 9B, and then an anisotropic etching process may be performed on the spacer layer to form an insulation spacer 15 covering sidewalls of the second separation pattern 11, the first buried insulation layer 13, the first separation pattern 9, and the storage node pad XP. When the insulation spacer 15 includes a single-layer or a multi-layer of an insulating material, one or more insulating material layers may be deposited, and then the anisotropic etching process may be performed to form the insulation spacer 15. If the insulation spacer 15 includes the air gap AG as described in FIGS. 2A and 2B, the insulation spacer 15 may be formed by the following process. First, the inner spacer 15b may be formed as illustrated in FIG. 2A. Alternatively, the inner spacer 15b may be formed of at least one of various insulating materials. The inner spacer 15b may be omitted as illustrated in FIG. 2B. A sacrificial spacer may be formed in a region where the air gap AG will be formed. The outer spacer 15a may be formed to cover a sidewall of the sacrificial spacer. Subsequently, the sacrificial spacer may be selectively removed to form the air gap AG. These processes will be described in more detail hereinafter.

In at least one example embodiment, the sacrificial spacer may be a hydrocarbon layer or a polymer layer capable of being decomposed by heat. In this case, the outer spacer 15a may be a porous silicon oxy hydrocarbon (SiOCH) layer. An ashing process may be performed or heat may be applied for selectively removing the sacrificial spacer. Oxygen may penetrate the porous outer spacer 15a and then react with the hydrocarbon layer of the sacrificial spacer during the ashing process. Thus, the sacrificial layer may be converted into carbon dioxide ($CO_2$) gas, carbon monoxide (CO) gas, and/or methane gas, and then the gases may be output through the porous outer spacer 15a during the ashing process. Alternatively, the polymer layer of the sacrificial layer may be decomposed into gases by the applied heat, and then the gases may be output through the porous outer spacer 15a. As a result, the air gap AG may be formed.

In another example embodiment, the sacrificial spacer may be formed of a material having an etch selectivity with respect to the inner and outer spacers 15b and 15a. If the sacrificial spacer is formed of a silicon oxide layer, then the inner and outer spacers 15b and 15a may be formed of silicon nitride layers. A portion of the outer spacer 15a may be removed to expose the sacrificial spacer, and then the exposed sacrificial spacer may be selectively removed by an isotropic etching process. Additionally, the removed region of the outer spacer 15a may be closed by an additional insulation layer.

Figure 10A:
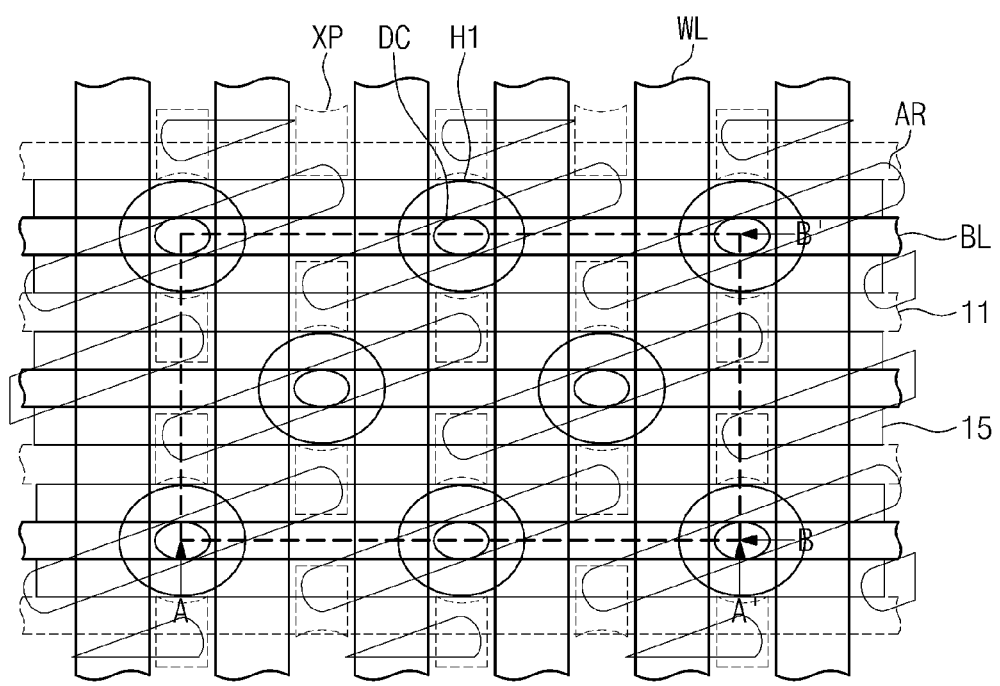
Figure 10B:
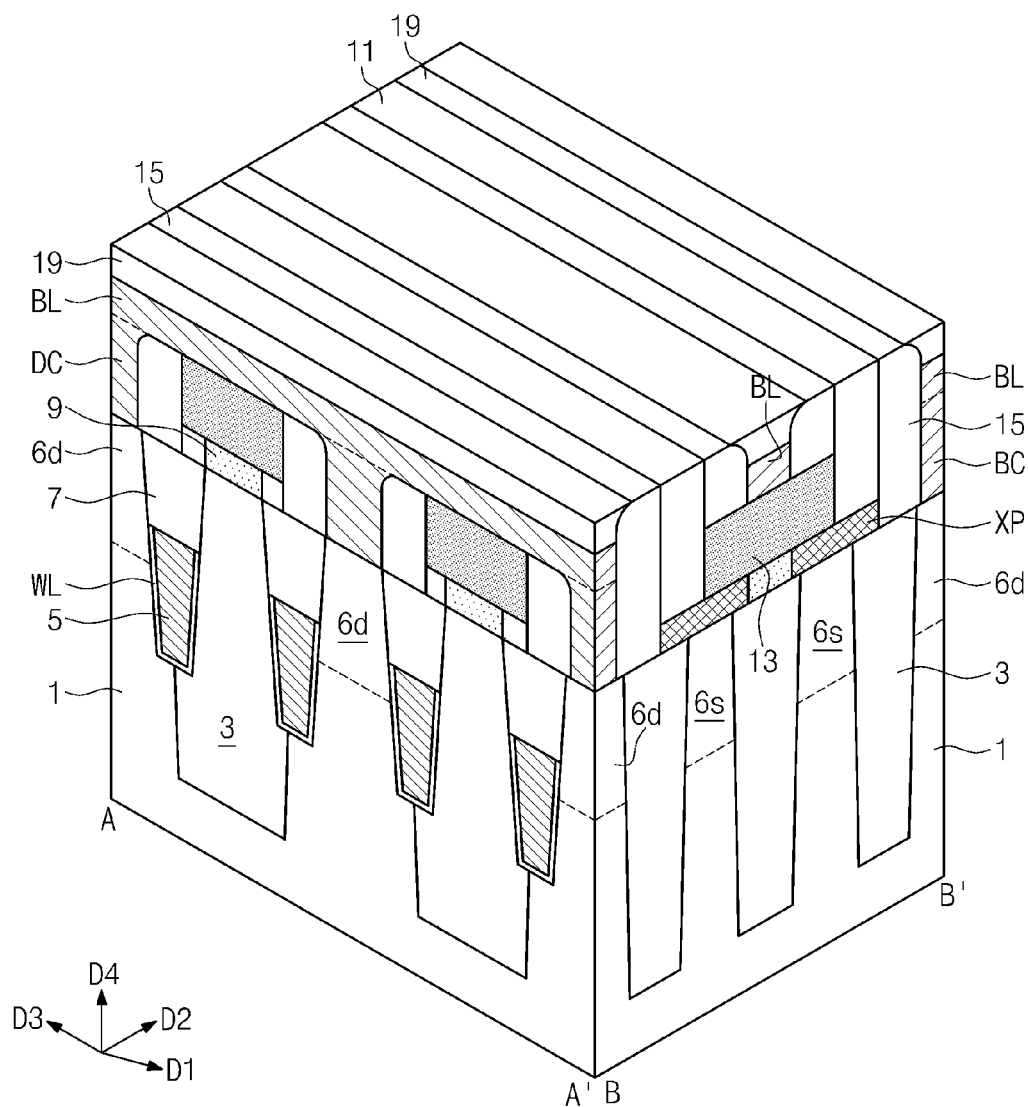

Referring to FIGS. 10A and 10B, a conductive layer may be formed on the substrate 1 to fill the bit line node hole H1 and a space on the recessed first buried insulation layer 13 between portions of the second separation pattern 11, and then the conductive layer may be planarized to form a bit line node contact DC in the bit line node hole H1 and a bit line BL on the recessed first buried insulation layer 13 at the same time. Subsequently, a second capping pattern 19 may be formed on the bit line BL. The second capping pattern 19 may be formed of the same or substantially the same material as the first capping pattern 7.

Figure 11A:
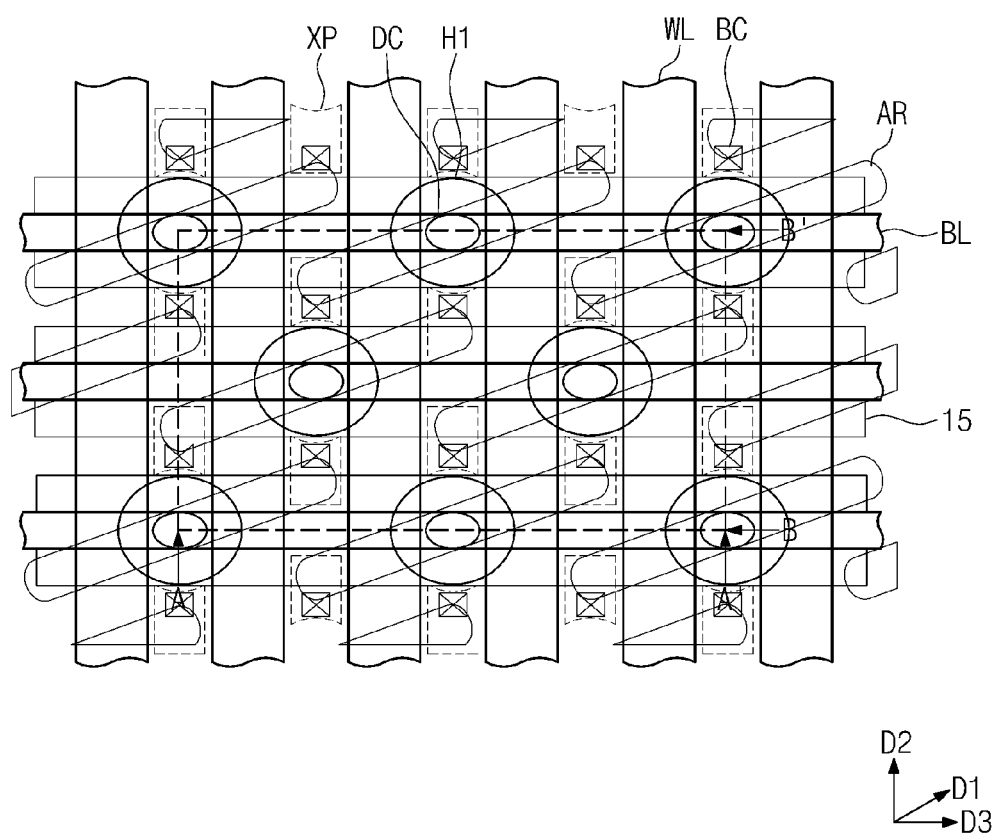
Figure 11B:
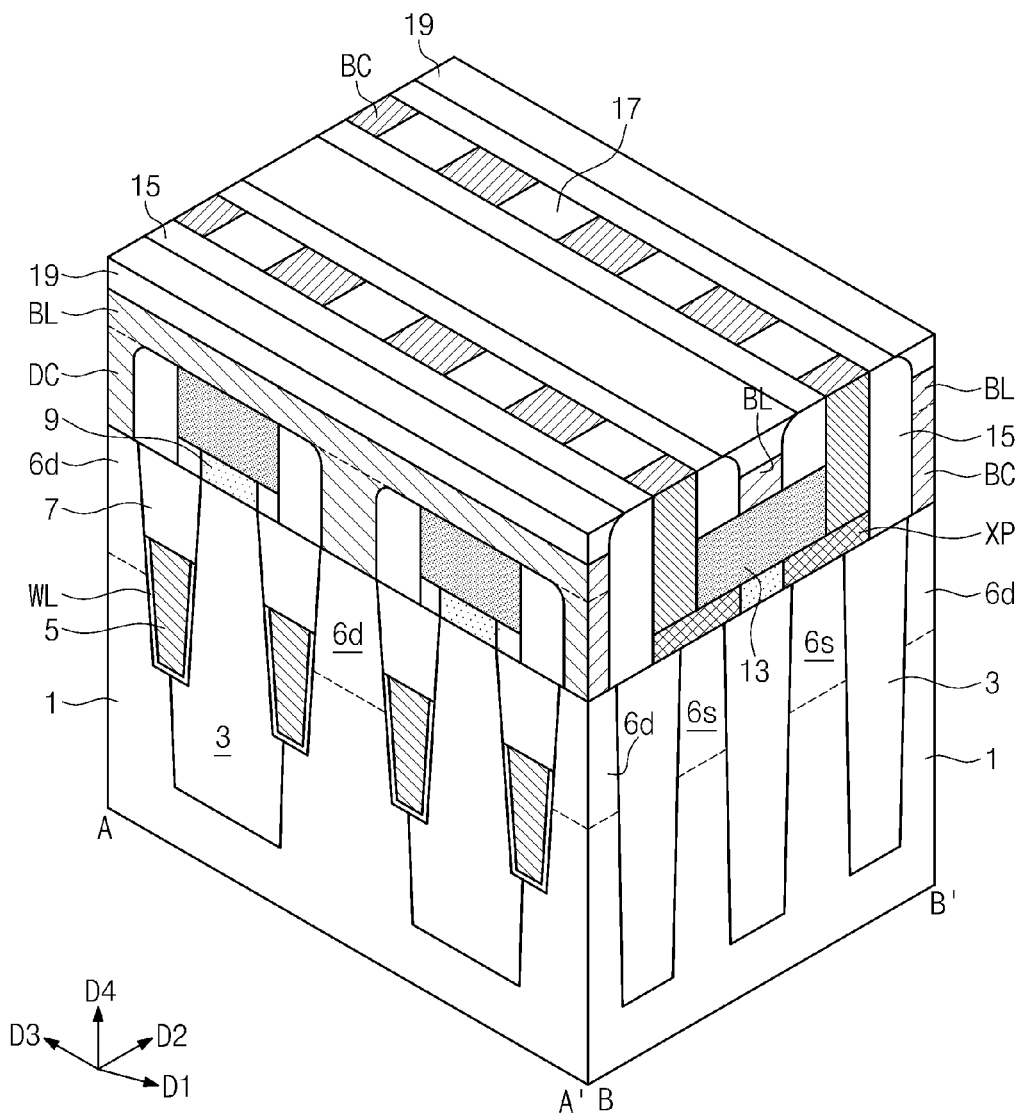

Referring to FIGS. 11A and 11B, storage node contacts BC and second buried insulation layers 17 may be formed in a position of the second separation pattern 11. The storage node contacts BC may be in contact with the storage node pads XP, respectively. The second buried insulation layers 17 may be formed between the storage node contacts BC. The method of forming the storage node contacts BC and the second buried insulation layers 17 may include the following processes.

In at least one example embodiment, if the second separation pattern 11 is formed of a conductive material, then first portions of the second separation pattern 11 may be removed to form holes for the second buried insulation layers 17. At this time, second portions of the second separation pattern 11 may remain to have plug shapes. The remaining second portions of the second separation pattern 11 may correspond to the storage node contacts BC. Next, the holes may be filled with an insulating material to form the second buried insulation layers 17. The second buried insulation layers 17 may fill the holes, respectively.

In another example embodiment, if the second separation pattern 11 is formed of an insulating material, first insulating portions of the second separation pattern 11 may be removed to form holes for the storage node contacts BC. The holes for the storage node contacts BC may expose the storage node pads XP, respectively. At this time, second insulating portions of the separation pattern 11 may remain to have plug shapes. The remaining second insulating portions of the separation pattern 11 may correspond to the second buried insulation layers 17. Subsequently, the holes exposing the storage node pads XP may be filled with a conductive material to form the storage node contacts BC.

In still another example embodiment, after the second separation pattern 11 is completely removed, a deposition process and an etching process may be repeatedly performed to a region where the second separation pattern 11 is completely removed, thereby forming the storage node contacts BC and the second buried insulation layers 17.

Subsequently, referring again to FIGS. 1A to 1C, the lower electrodes BE may be formed to be connected to the storage node contacts BC, respectively. Even though not shown in the drawings, a dielectric layer and an upper electrode may be sequentially formed on the lower electrode BE.

According to the example embodiment of the method of fabricating the semiconductor device described above, the second separation pattern 11 may be formed at the region where the storage node contact BC will be formed, and then the bit line BL and the bit line node contact DC may be formed to be self-aligned with the second separation pattern 11. Thus, the bridge problem caused by mask-misalignment may be resolved and/or prevented. As a result, the bit line BL, the bit line node contact DC, and the storage node contact BC may be self-aligned with each other, such that the semiconductor device having improved reliability may be realized.

The bit line node hole H1 may have a circular shape or an elliptical shape in a plan view as illustrated in FIGS. 8A, 8B, 9A, and 9B. Alternatively, the bit line node hole H1 may have one of other shapes. This will be described in more detail hereinafter.

Figure 12A:
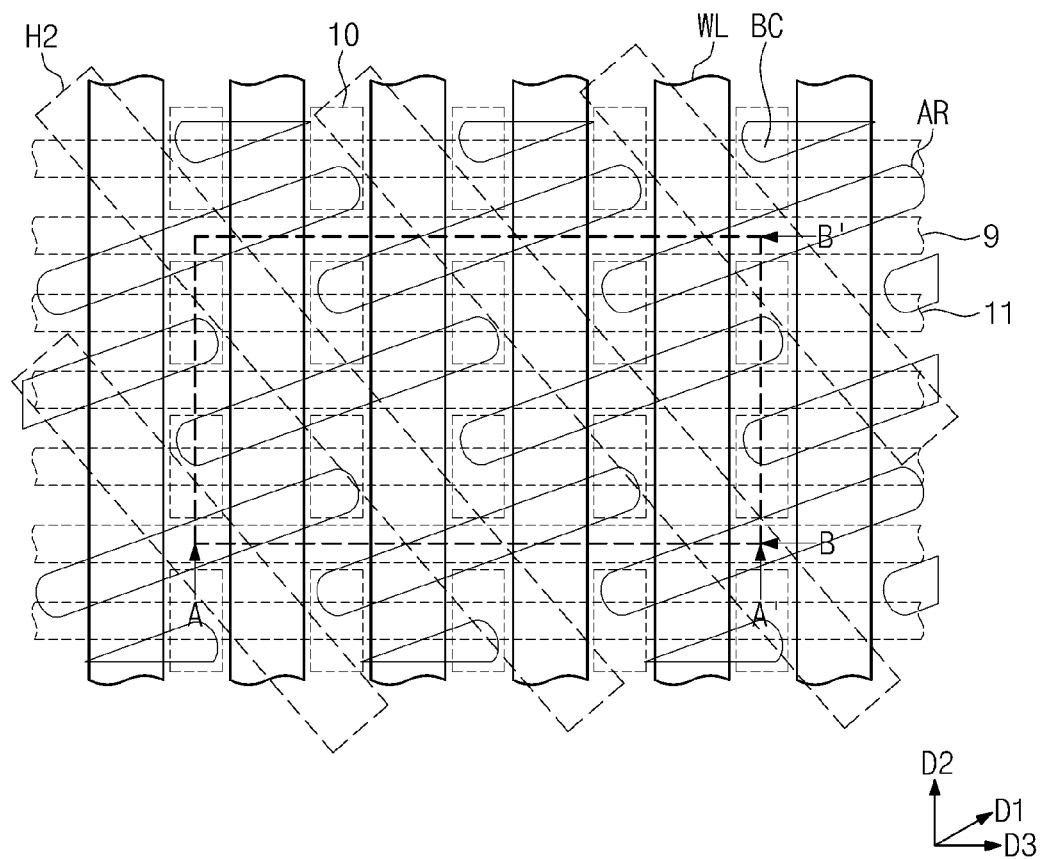
FIG. 12A is a plan view illustrating a part of another example embodiment of a method of fabricating a semiconductor device of FIG. 1A.
Figure 12B:
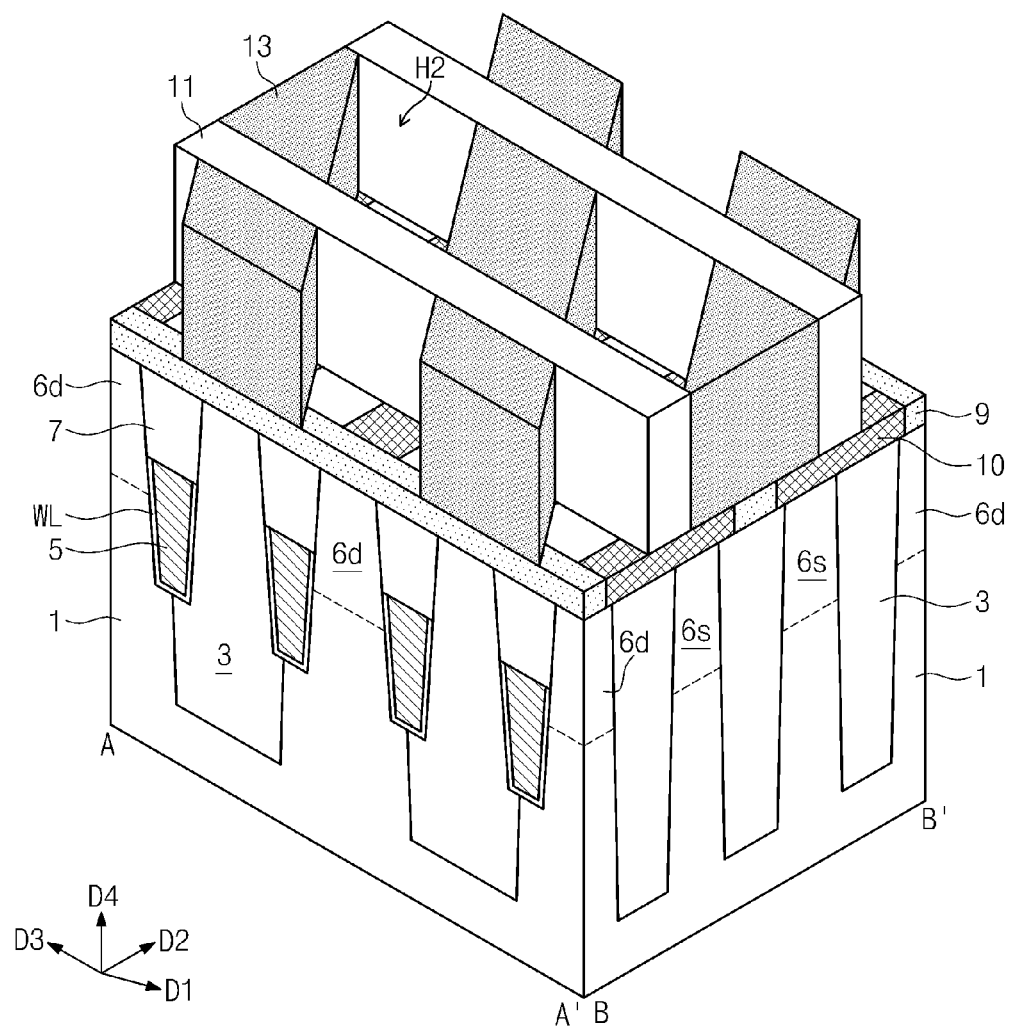
FIG. 12B is a perspective view illustrating a part of another example embodiment of a method of fabricating a semiconductor device of FIG. 1B.

FIG. 12A is a plan view illustrating a part of a method of fabricating a semiconductor device of FIG. 1A according to other example embodiments of inventive concepts. FIG. 12B is a perspective view illustrating a part of a method of fabricating a semiconductor device of FIG. 1B according to other example embodiments of inventive concepts.

Referring to FIGS. 12A and 12B, a bit line node hole H2 may be formed in the first buried insulation layer 13. The bit line node hole H2 may have a quadrilateral shape or a parallelogram-shape in a plan view. The bit line node hole H2 may be formed to overlap with the second dopant injection region 6d. A third mask pattern having an opening may be formed on the second separation pattern 11 and the first buried insulation layer 13. The opening of the third mask pattern may have a diagonal shape overlapping with the second dopant injection regions 6d arranged in a longitudinal direction of the opening. The first buried insulation layer 13 may be etched using the third mask pattern as an etch mask to form the bit line node holes H2. In this case, an area of the exposed sidewall of the second separation pattern 11 may be greater than that of the second separation pattern 11 illustrated in FIG. 8B. Subsequently, the same or substantially the same processes described above may be performed.

Figure 13A:
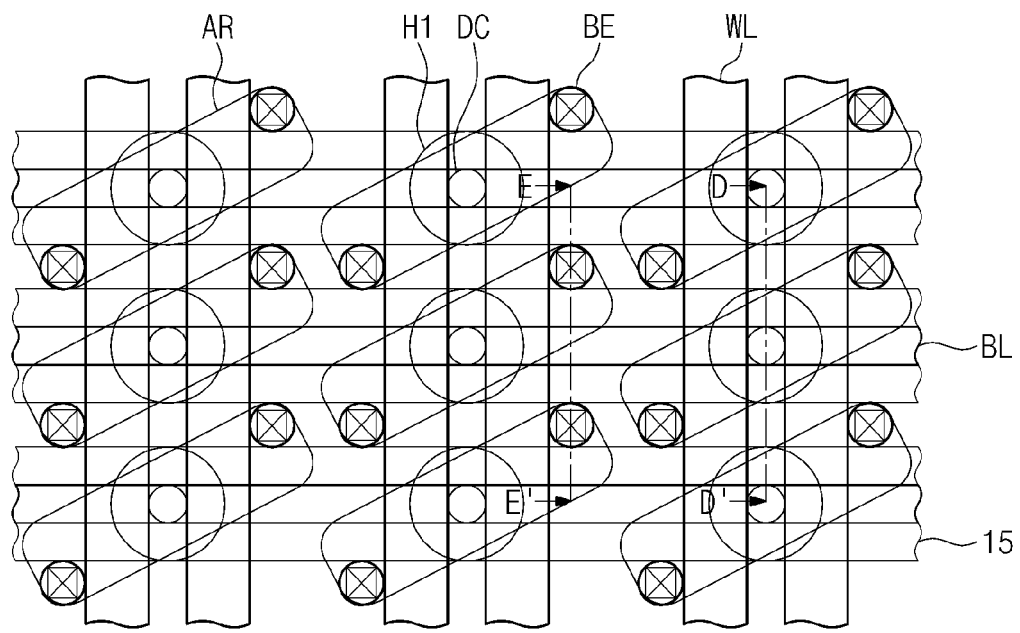
FIG. 13A is a plan view illustrating a semiconductor device according to still other example embodiments of inventive concepts.
Figure 13B:
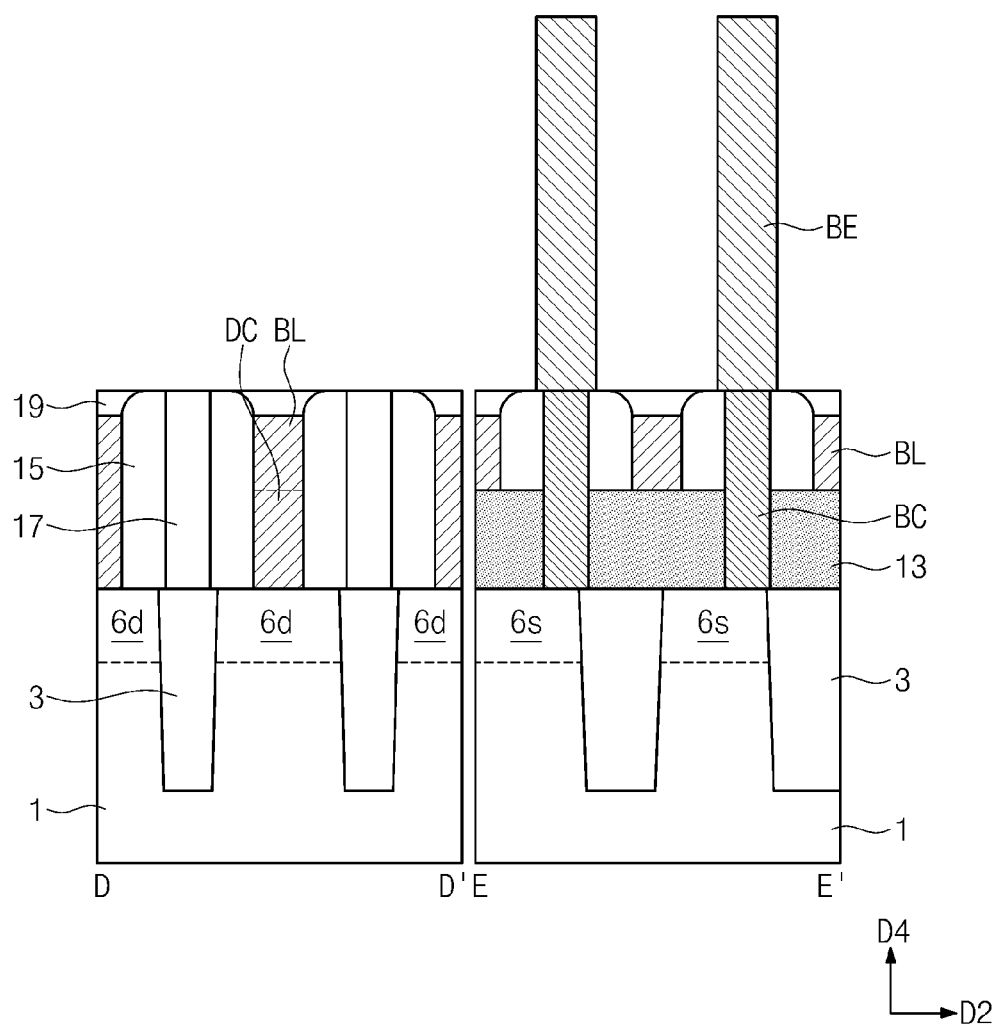
FIG. 13B is a cross-sectional view taken along lines D-D' and E-E' of FIG. 13A.

FIG. 13A is a plan view illustrating a semiconductor device according to still other example embodiments of inventive concepts. FIG. 13B is a cross-sectional view taken along lines D-D' and E-E' of FIG. 13A.

Referring to FIGS. 13A and 13B, a device isolation layer 3 may be disposed in or on a substrate 1 to define active regions AR. Arrangement of the active regions AR according to at least this example embodiment is different from the arrangement of the active regions AR illustrated in FIGS. 1A to 1C.

In this example embodiment, the active regions AR may have long bar shapes extending in parallel or substantially parallel to each other in a first direction D1. Additionally, end portions of the active regions AR adjacent to each other may be close to each other, and center portions of the adjacent active regions AR may be close to each other. A plurality of word lines WL extending in a second direction D2 may be disposed in the substrate 1 to cross the active regions AR and the device isolation layer 3. Top surfaces of the word lines WL may be lower than a top surface of the substrate 1. A gate insulation layer 5 may be disposed between the substrate 1 and the word lines WL. A first dopant injection region 6s may be disposed in the substrate 1 of the active region AR at a side of the word line WL, and a second dopant injection region 6d may be disposed in the substrate 1 of the active region AR at another side of the word line WL.

A first capping pattern 7 may be disposed on each of the word lines WL. A top surface of the first capping pattern 7 may be disposed at substantially the same height as the top surface of the substrate 1. The semiconductor device according to at least this example embodiment may not include the first separation pattern 9 and the storage node pad XP of FIGS. 1A to 1C.

Bit lines BL may be disposed on the substrate 1 and may extend in a third direction D3 crossing the first and second directions D1 and D2. The bit line BL is electrically connected to the second dopant injection region 6d through a bit line node contact DC. The bit line BL may have the same or substantially the same width as the bit line node contact DC. A sidewall of the bit line BL may be aligned with a sidewall of the bit line node contact DC. A first buried insulation layer 13 may be disposed between the bit line BL and the substrate 1 at a side of the bit line node contact DC.

Storage node contacts BC may be disposed between the bit lines BL. The storage node contacts BC may be connected to the first dopant injection regions 6s, respectively. Second buried insulation layers 17 may be disposed between the storage node contacts BC. The storage node contact BC may have a sidewall laterally aligned with a sidewall of the second buried insulation layer 17.

The storage node contact BC may include at least one of a metal silicide, a doped poly-silicon, a metal nitride, and a metal. The storage node contact BC may have a sidewall vertically aligned with a sidewall of the first buried insulation layer 13. Distances between the storage node contacts BC and the bit lines BL may be uniform or substantially uniform regardless (or independent) of positions thereof.

Other elements of the example embodiment may be the same as/similar to the elements corresponding thereto in the example embodiment described with reference to FIGS. 1A to 1C.

FIGS. 14A, 15A, 16A, 17A, 18A, and 19A are plan views illustrating an example embodiment of a method of fabricating a semiconductor device of FIG. 13A. FIGS. 14B, 15B, 16B, 16C, 17B, 18B, and 19B are cross-sectional views illustrating an example embodiment of a method of fabricating a semiconductor device of FIG. 13B.

Figure 14A:
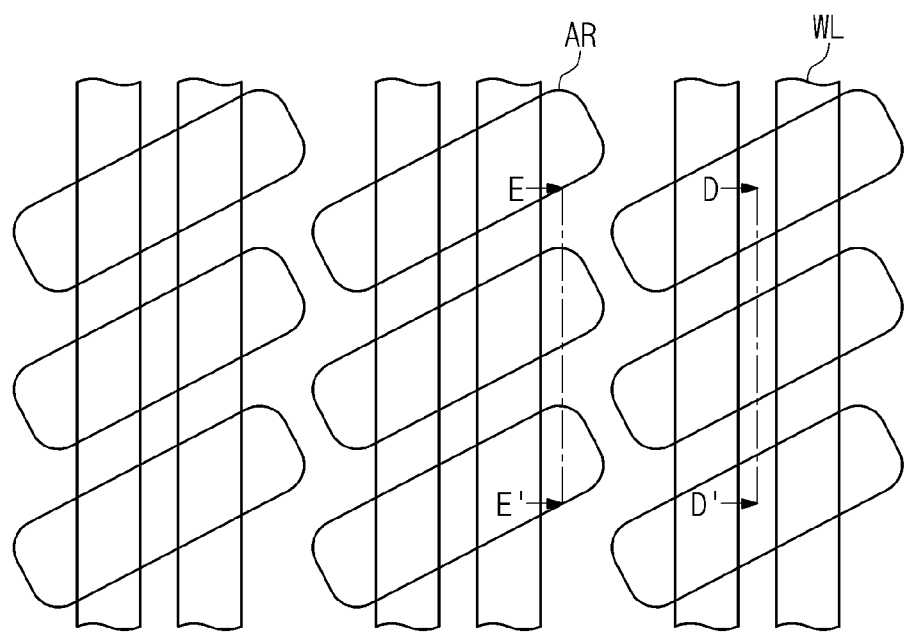
FIGS. 14A, 15A, 16A, 17A, 18A, and 19A are plan views illustrating an example embodiment of a method of fabricating a semiconductor device of FIG. 13A.
Figure 14A:
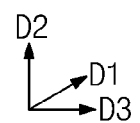
Figure 14B:
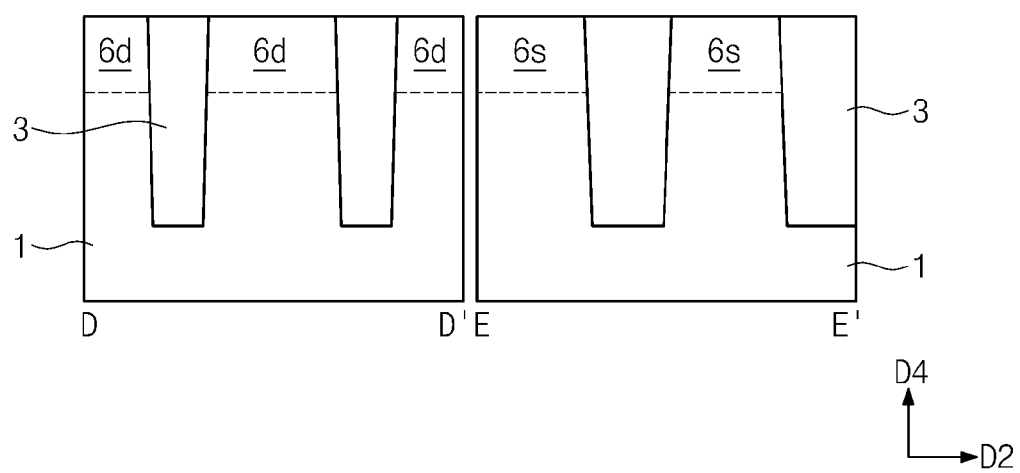
FIGS. 14B, 15B, 16B, 16C, 17B, 18B, and 19B are cross-sectional views illustrating an example embodiment of a method of fabricating a semiconductor device of FIG. 13B.

Referring to FIGS. 14A and 14B, a device isolation layer 3 may be formed in or on a substrate 1 to define active regions AR. The active regions AR may have long bar shapes extending in parallel or substantially parallel to each other in a first direction D1. End portions of the active regions AR adjacent to each other may be close to each other, and center portions of the adjacent active regions AR may be close to each other. A plurality of word lines WL may be formed in the substrate 1 to cross the active regions AR and the device isolation layer 3, as described in the above example embodiment. A gate insulation layer may be formed between the substrate 1 and the word line WL, and a first capping pattern may be formed on each of the bit line WL. An ion implantation process may be performed to form a first dopant injection region 6s and a second dopant injection region 6d in the substrate 1 of the active region AR adjacent to both sides of the word line WL.

Figure 15A:
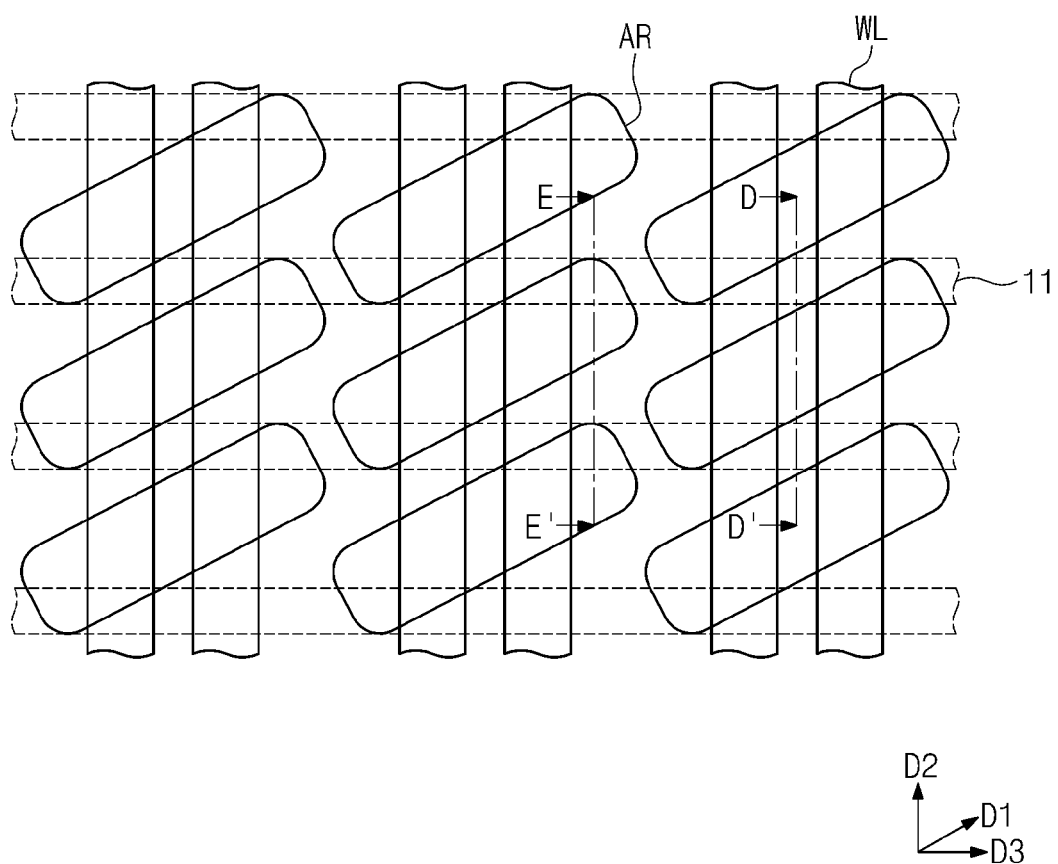
Figure 15B:
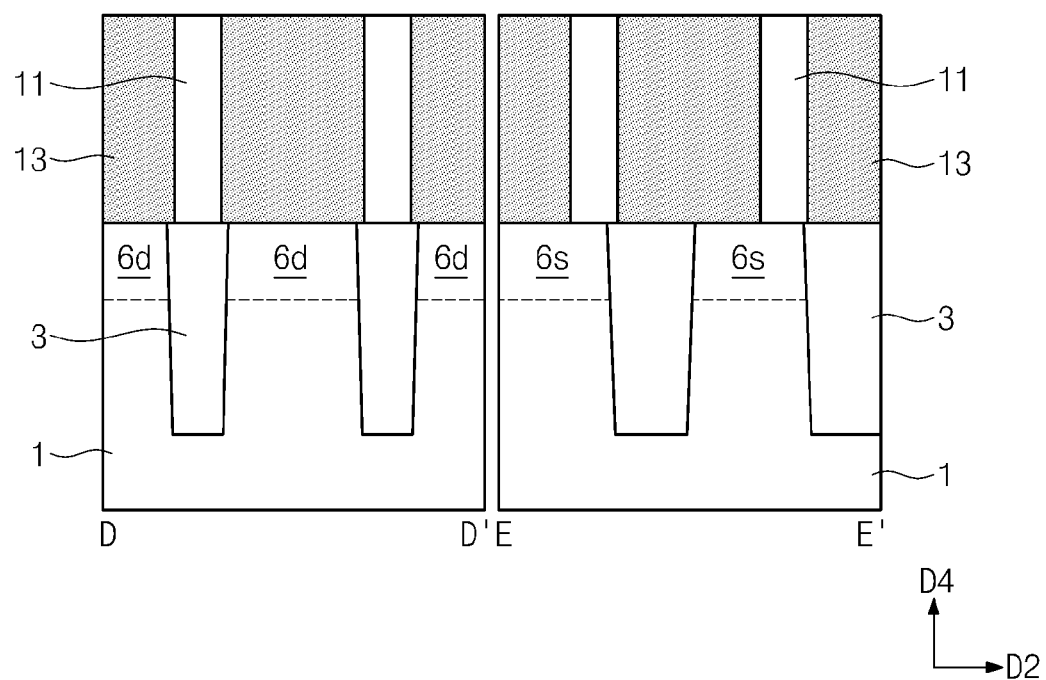

Referring to FIGS. 15A and 15B, separation patterns 11 may be formed on the substrate 1. The separation patterns 11 may be formed of a conductive material or an insulating material. The separation patterns 11 may be formed of a material having an etch selectivity with respect to the first capping pattern. A first buried insulation layer 13 may be formed to fill a space between the separation patterns 11. The buried insulation layer 13 may be formed of an insulating material having an etch selectivity with respect to the separation patterns 11. The formation order of the separation pattern 11 and the first buried insulation layer 13 may be changed.

Figure 16A:
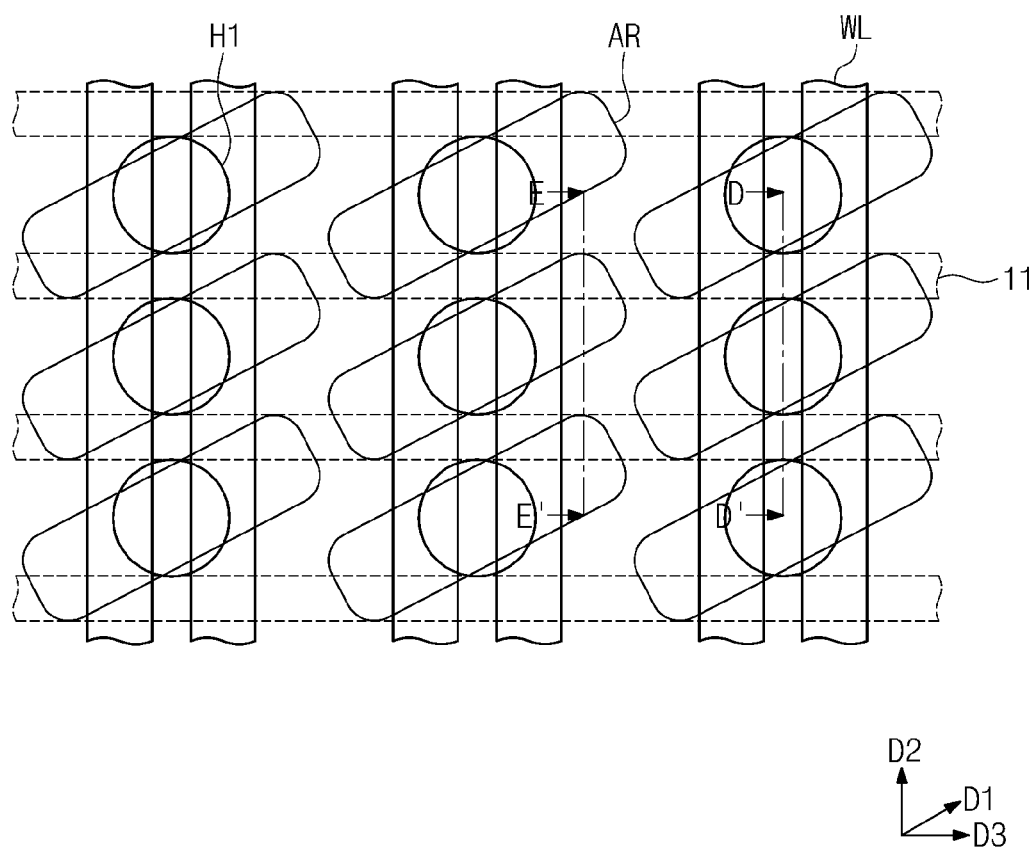
Figure 16B:
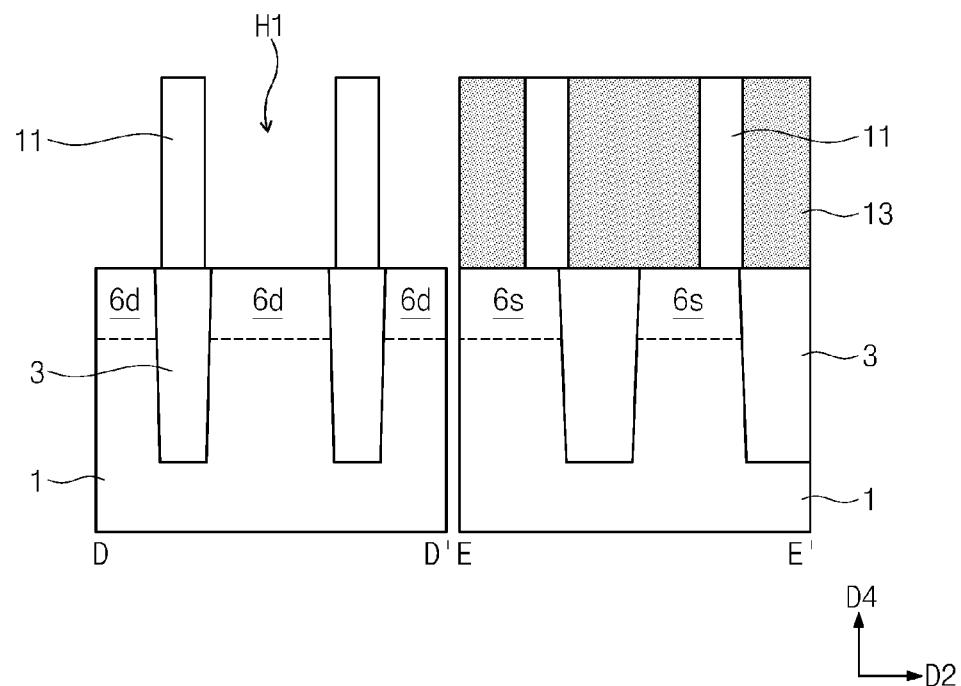

Referring to FIGS. 16A and 16B, the first buried insulation layer 13 may be patterned to form bit line node holes H1. The bit line node hole H1 may expose the second dopant injection region 6d. A portion of a sidewall of the separation pattern 11 may be exposed by the bit line node hole H1.

Figure 16C:
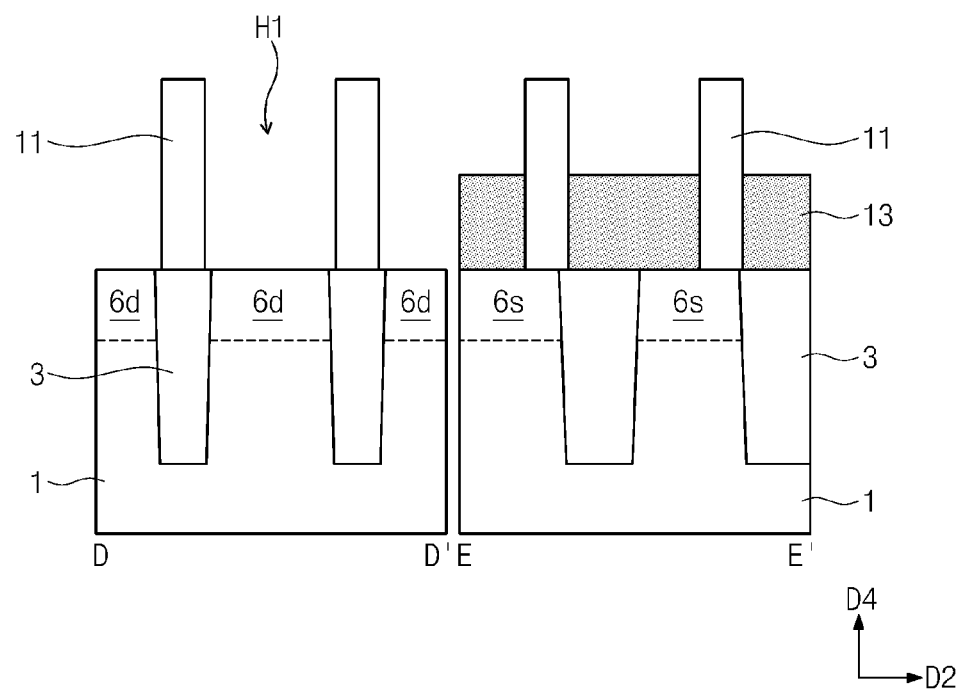

Referring to FIGS. 16A and 16C, an upper portion of the first buried insulation layer 13 may be recessed to expose upper sidewalls of the separation pattern 11.

Figure 17A:
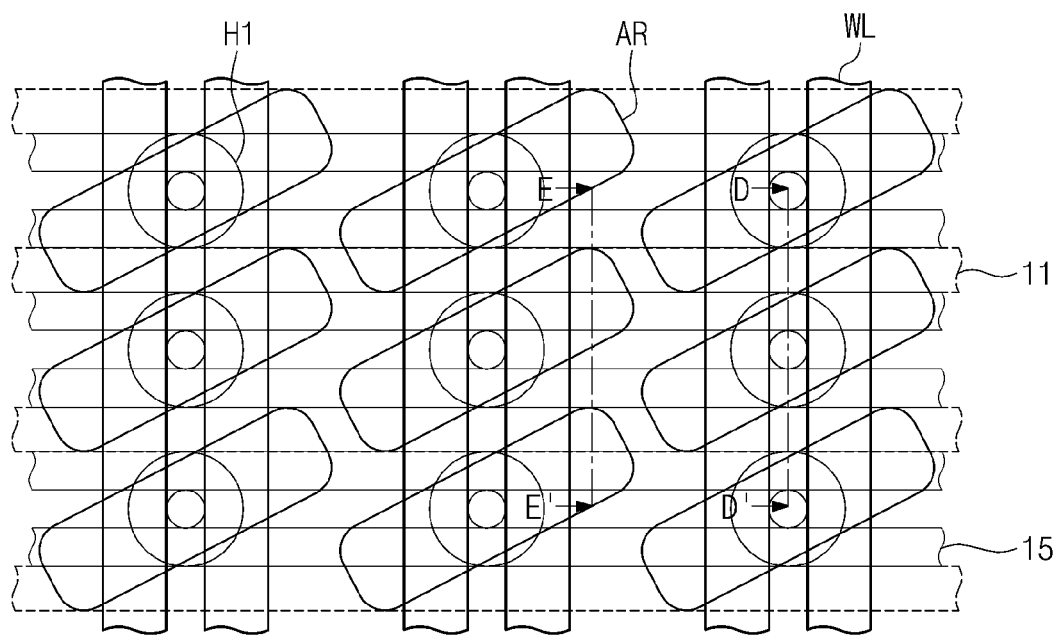
Figure 17A:
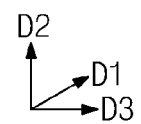
Figure 17B:
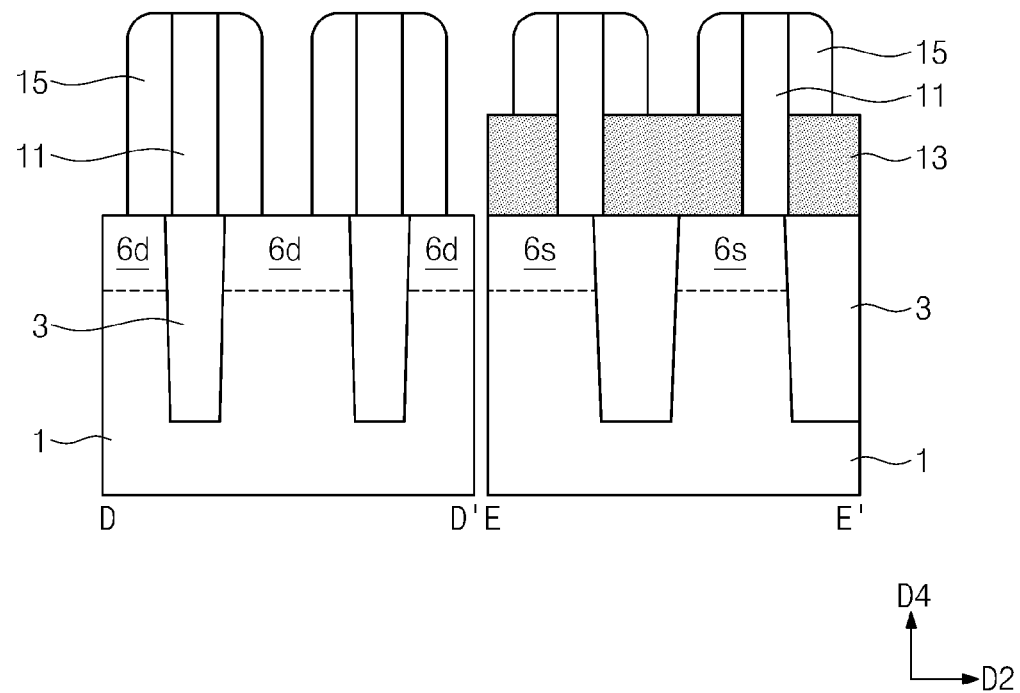

Referring to FIGS. 17A and 17B, a spacer layer may be conformally formed on the substrate 1, and then an anisotropic etching process may be performed on the spacer layer to form an insulation spacer 15 covering the sidewalls of the separation pattern 11 and the first buried insulation layer 13.

Figure 18A:
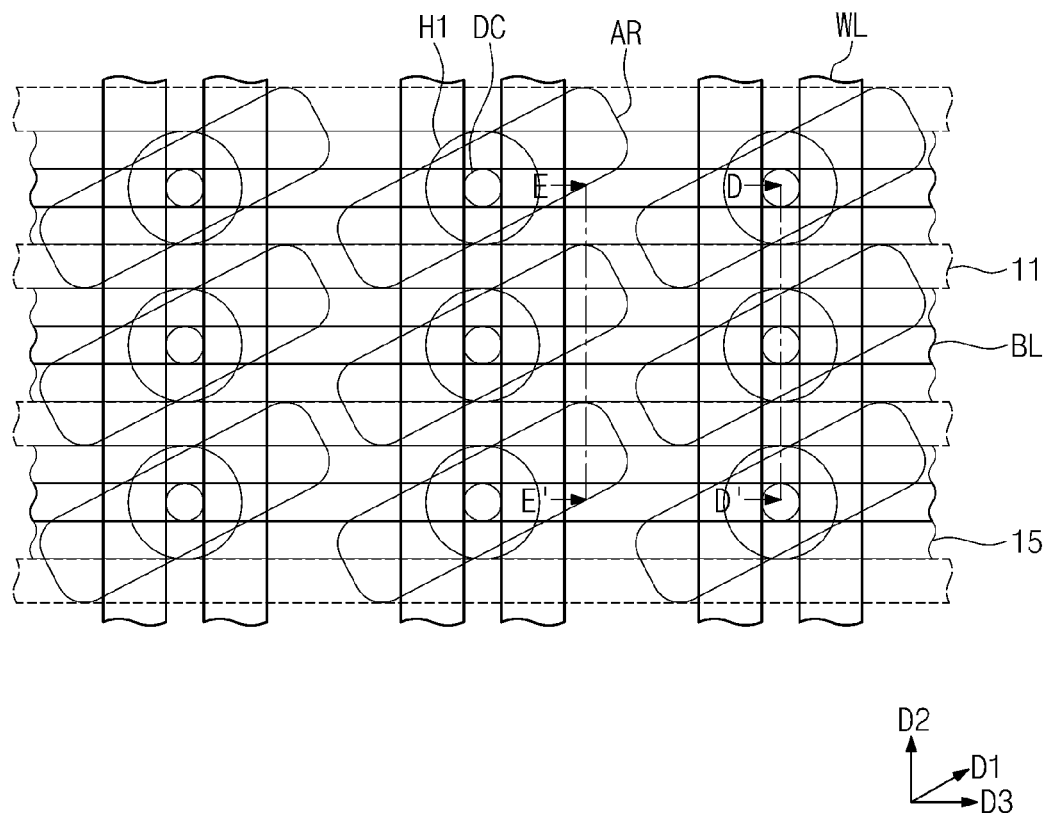
Figure 18B:
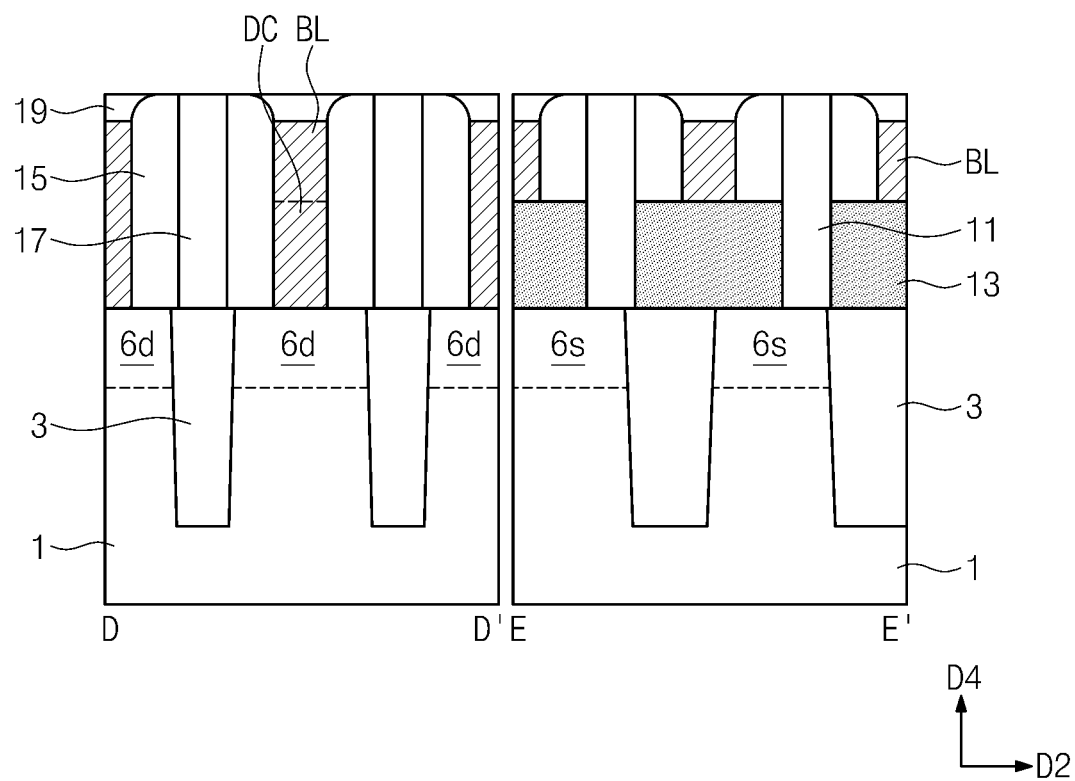

Referring to FIGS. 18A and 18B, a conductive layer may be formed on the substrate 1 to fill the bit line node hole H1 and a space between the separation patterns 11 on the recessed first buried insulation layer 13, and then a planarization etching process may be performed to form a bit line node contact DC in the bit line node hole H1 and a bit line BL on the recessed buried insulation layer 13 at the same or substantially the same time. A second capping pattern 19 may be formed on the bit line BL. The second capping pattern 19 may be formed of the same or substantially the same material as the first capping pattern.

Figure 19A:
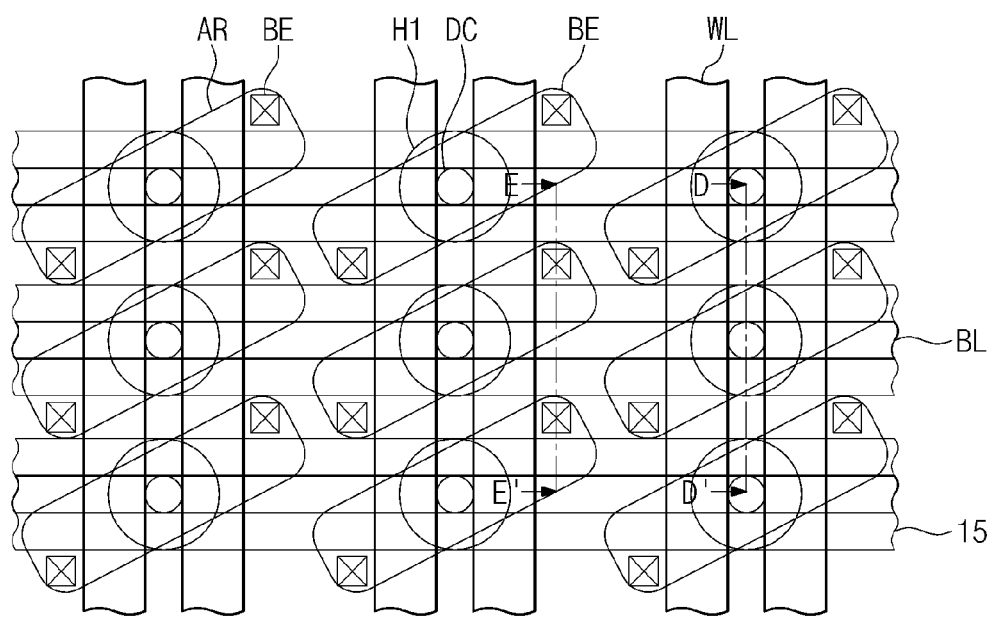
Figure 19A:
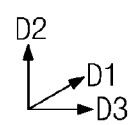
Figure 19B:
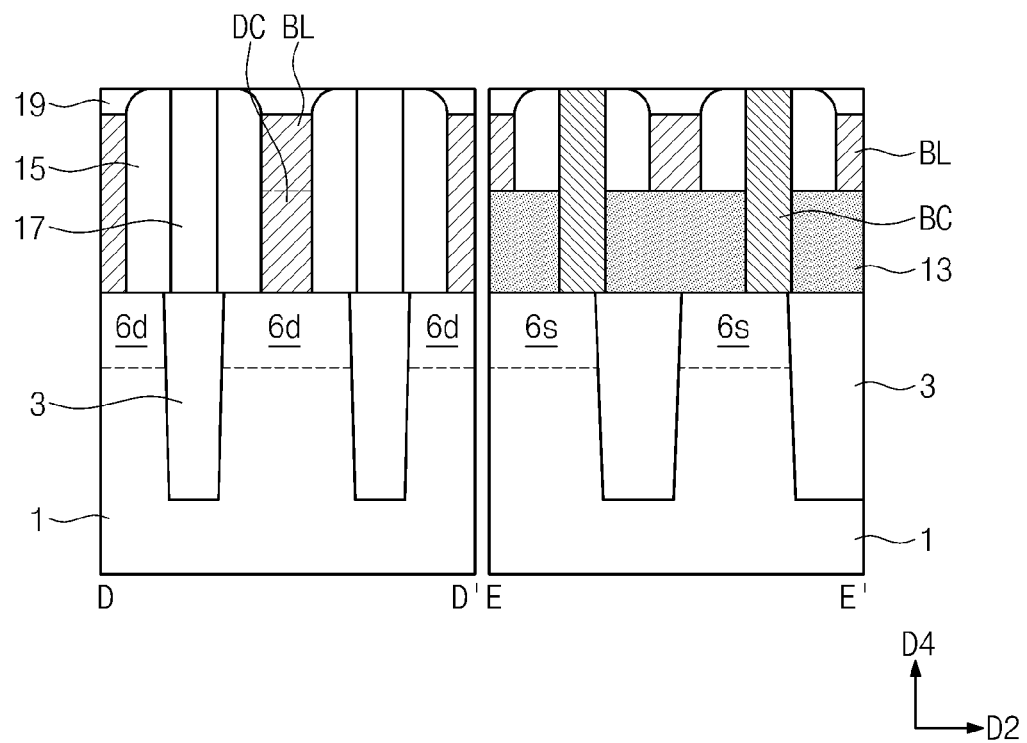

Referring to FIGS. 19A and 19B, storage node contacts BC and second buried insulation layers 17 may be formed in a position of the separation pattern 11. The storage node contacts BC may be formed to be in contact with the first dopant injection regions 6s, respectively. The formation processes of the storage node contacts BC and the second buried insulation layers 17 may be the same as/similar to the processes described with reference to FIG. 11B.

Subsequently, the lower electrodes BE may be formed to be connected to the storage node contacts BC, respectively, as illustrated in FIGS. 13A and 13B. Even though not shown in the drawings, a dielectric layer and an upper electrode may be sequentially formed on the lower electrode BC.

The semiconductor devices in the aforementioned example embodiments may be encapsulated using various packaging techniques. For example, the semiconductor devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which semiconductor devices according to one or more of the above discussed example embodiments is mounted may further include at least one semiconductor device (e.g., a controller and/or a logic device) that controls the semiconductor memory device.

Figure 20:
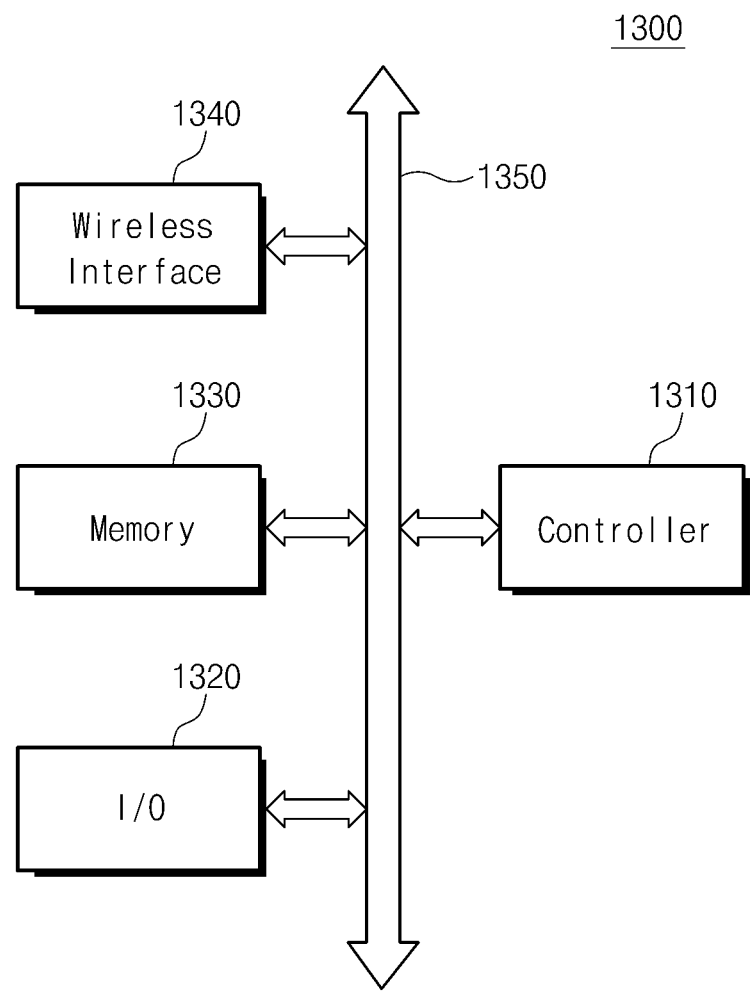
FIG. 20 is a schematic block diagram illustrating an example of electronic devices including a semiconductor device according to example embodiments of inventive concepts.

FIG. 20 is a schematic block diagram illustrating an example of electronic devices including semiconductor device according to example embodiments of inventive concepts.

Referring to FIG. 20, an electronic device 1300 according to example embodiments of inventive concepts may be a personal digital assistant (PDA), a laptop computer, a portable computer, web tablet, a wireless phone, a mobile phone, a digital music player, a wire/wireless electronic device, or a complex electronic device including at least two thereof. The electronic device 1300 may include a controller 1310, an input/output (I/O) unit 1320 (e.g., a keypad, a keyboard and/or a display), a memory device 1330, and wireless interface unit 1340 which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. Additionally, the memory device 1330 may be used for storing a user data. The memory device 1330 includes a semiconductor device according to the aforementioned example embodiments of inventive concepts. The electronic device 1300 may use the wireless interface unit 1340 for transmitting data to a wireless communication network communicating with a radio frequency (RF) signal or receiving data from the network. For example, the wireless interface unit 1340 may include an antenna or a wireless transceiver. The electronic device 1300 according to example embodiments of inventive concepts may be used in a communication interface protocol such as a third generation communication system (e.g., CDMA, GSM, NADC, E-TDMA, WCDAM, and/or CDMA2000).

Figure 21:
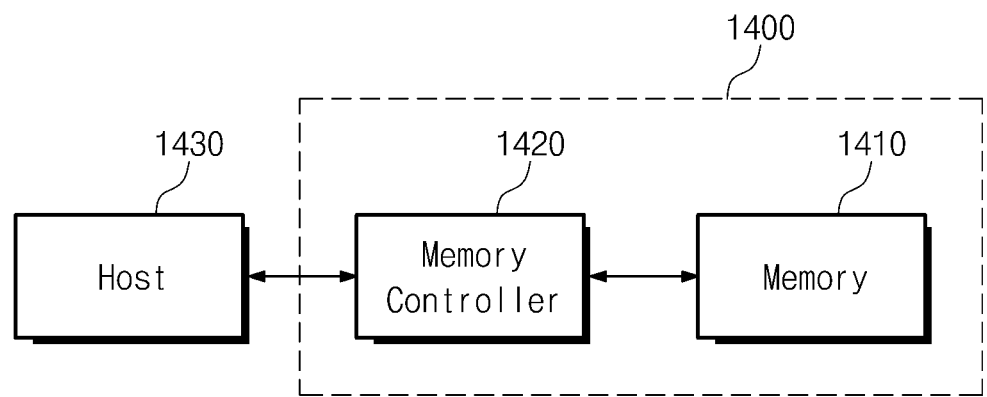
FIG. 21 is a schematic block diagram illustrating an example of memory systems including semiconductor devices according to example embodiments of inventive concepts.

FIG. 21 is a schematic block diagram illustrating an example of memory systems including semiconductor devices according to example embodiments of inventive concepts.

Referring to FIG. 21, the semiconductor devices according to aforementioned example embodiments may be used for realizing a memory system. A memory system 1400 may include a memory device 1410 and a memory controller 1420 for storing massive data. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include the semiconductor device according to the above discussed example embodiments of inventive concepts.

In semiconductor devices according to example embodiments of inventive concepts, the bit line and the bit line node contact have the sidewalls aligned with each other, respectively. Additionally, the distances between the storage node contact and the bit lines are substantially uniform. Thus, the cell dispersion may be reduced and the reliability of semiconductor devices may be improved.

Additionally, the insulation spacer is disposed between the bit line and the storage node contact and between the bit line node contact and the storage node contact. The insulation spacer may include the air gap, such that the insulation characteristic between the storage node contact and the bit line may increase to suppress and/or prevent leakage current therebetween.

Moreover, semiconductor devices may include the storage node pad disposed in the space confined by the capping patterns protruding from the substrate and the separation patterns. The contact area between the storage node pad and the substrate of the active region may increase to reduce a contact resistance between the storage node pad and the substrate.

In methods of fabricating semiconductor devices according to example embodiments of inventive concepts, the separation pattern may be first formed in a region in which the storage node contact will be formed, and then the bit line and the bit line node contact may be formed using the separation pattern in the self-alignment manner. Thus, the bridge problem caused by the mask misalignment may be resolved. As a result, the reliability of semiconductor devices may be improved.

Additionally, the first separation pattern and the second separation pattern may be formed using the double patterning technology (DPT). Thus, the semiconductor device may be realized using the photolithography process using the ArF and/or KrF light source, not the EUV light source. As a result, the fabrication costs of semiconductor devices may be reduced and/or minimized.

While inventive concepts has been described with reference to example embodiments, it will be apparent to those skilled in the art that various changes and modifications may be made without departing from the spirit and scope of inventive concepts. Therefore, it should be understood that the above embodiments are not limiting, but illustrative. Thus, the scope of inventive concepts is to be determined by the broadest permissible interpretation of the following claims and their equivalents, and shall not be restricted or limited by the foregoing description.

What is claimed is:

1. A semiconductor device comprising:
   a plurality of word lines extending in a first direction in or on a substrate;
   a plurality of bit lines crossing over the plurality of word lines;
   a plurality of bit line node contacts, each of the plurality of bit line node contacts connecting a corresponding bit line to the substrate, and each of the plurality of bit line node contacts having a width substantially equal to a width of the corresponding bit line;
   a plurality of storage node contacts between the plurality of bit lines and connected to the substrate, a distance between a first sidewall of a first of the plurality of storage node contacts and a corresponding first bit line adjacent to the first sidewall is substantially equal to a distance between a second sidewall of the first storage node contact and a second bit line adjacent to the second sidewall; and
   a plurality of storage node pads, each of the plurality of storage node pads being between the substrate and a corresponding storage node contact, each of the plurality of storage node pads having a width greater than a width of the corresponding storage node contact, and a sidewall of each of the plurality of storage node pads being aligned with a sidewall of the corresponding storage node contact.

2. The semiconductor device of claim 1, wherein a sidewall of each of the plurality of bit line node contacts is aligned with a sidewall of the corresponding bit line.

3. The semiconductor device of claim 1, wherein a distance between a first of the plurality of bit line node contacts and the first of the plurality of storage node contacts is substantially equal to a distance between the first of the plurality of storage node contacts and the corresponding first bit line.

4. The semiconductor device of claim 1, further comprising:
   a separation pattern between adjacent storage node pads, the separation pattern vertically overlapping with a corresponding bit line.

5. The semiconductor device of claim 1, further comprising:
   a buried insulation layer between the substrate and each bit line, a sidewall of the buried insulation layer being aligned with a sidewall of the corresponding storage node contact.

6. The semiconductor device of claim 1, further comprising:
   an insulation spacer between each bit line and corresponding storage node contact, and between each bit line node contact and corresponding storage node contact.

7. The semiconductor device of claim 6, wherein the insulation spacer includes an air gap.

8. The semiconductor device of claim 1, further comprising:
   a data storage element electrically connected to the first of the plurality of storage node contacts.

9. A semiconductor device comprising:
   at least two storage node contacts in or on a substrate;
   a bit line node contact on the substrate between the at least two storage node contacts;
   a bit line on the bit line node contact between the at least two storage node contacts, each of the bit line node contact and the bit line being spaced apart from sidewalls of the at least two storage node contacts by substantially the same distance; and
   a storage node pad between the substrate and a first of the at least two storage node contacts, the storage node pad having a width greater than a width of the first of the at least two storage node contacts, and wherein a sidewall of the storage node pad is aligned with a sidewall of the first of the at least two storage node contacts.

10. The semiconductor device of claim 9, wherein a sidewall of the bit line is vertically aligned with a sidewall of the bit line node contact.

11. The semiconductor device of claim 9, further comprising:
    an insulation spacer between the bit line and the first of the at least two storage node contacts and between the bit line node contact and the first of the at least two storage node contacts.

12. The semiconductor device of claim 11, wherein the insulation spacer includes an air gap.

13. The semiconductor device of claim 9, further comprising:
    a data storage element electrically connected to the first of the at least two storage node contacts.

14. A semiconductor device comprising:
    at least two storage node contacts in or on a substrate;
    a bit line node contact in or on the substrate between the at least two storage node contacts;

a bit line on the bit line node contact between the at least two storage node contacts, the bit line node contact and the bit line being spaced apart from sidewalls of the at least two storage node contacts by a spacer; and a storage node pad between the substrate and the at least two storage node contacts, the storage node pad having a width greater than a width of a first of the at least two storage node contacts, and a sidewall of the storage node pad being aligned with a sidewall of the first of the at least two storage node contacts.

15. The semiconductor device of claim 14, wherein a sidewall of the bit line is aligned with a sidewall of the bit line node contact.

16. The semiconductor device of claim 14, wherein a distance between the bit line node contact and the first of the at least two storage node contacts is substantially equal to a distance between the bit line and the first of the at least two storage node contacts.

17. The semiconductor device of claim 14, further comprising:
a buried insulation layer between the bit line and the substrate, a sidewall of the buried insulation layer being aligned with a sidewall of the first of the at least two storage node contacts.

18. The semiconductor device of claim 14, further comprising:
an insulation spacer between the bit line and the first of the at least two storage node contacts, and between the bit line node contact and the first of the at least two storage node contacts.

19. The semiconductor device of claim 18, wherein the insulation spacer includes an air gap.

20. The semiconductor device of claim 14, further comprising:
a data storage element electrically connected to the first of the at least two storage node contacts.

* * * * *